(12) United States Patent
Arimoto

(10) Patent No.: US 6,498,396 B1
(45) Date of Patent: *Dec. 24, 2002

(54) SEMICONDUCTOR CHIP SCALE PACKAGE AND BALL GRID ARRAY STRUCTURES

(75) Inventor: Kazutami Arimoto, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/623,082

(22) Filed: Mar. 28, 1996

(30) Foreign Application Priority Data

Mar. 30, 1995 (JP) ............................................. 7-073781
Aug. 8, 1995 (JP) ............................................. 7-202302
Feb. 23, 1996 (JP) ............................................. 8-036295

(51) Int. Cl.$^7$ ............................................. H01L 23/48
(52) U.S. Cl. ..................... 257/737; 257/203; 257/786; 257/734
(58) Field of Search ........................... 257/48, 737, 738, 257/786, 202, 203, 207, 296, 734

(56) References Cited

U.S. PATENT DOCUMENTS

| 4,005,456 A | * 1/1977 | Botzenhardt ................. 257/737 |
| 4,723,197 A | 2/1988 | Takiar et al. |
| 4,831,433 A | 5/1989 | Ogura et al. |

(List continued on next page.)

FOREIGN PATENT DOCUMENTS

| DE | 3446614 C2 | 7/1985 |
| DE | 4032154 A1 | 4/1991 |
| DE | 4233271 | 4/1993 |
| DE | 4325668 A1 | 7/1993 |
| DE | 4239587 A1 | 2/1994 |
| EP | 0335740 A2 | 10/1989 |
| EP | 0 188 431 B1 | 1/1991 |
| EP | 0 553 788 A2 | 8/1993 |
| EP | 0 323 438 B1 | 6/1994 |
| JP | 54-148485 | 11/1979 |
| JP | 59-151450 | 8/1984 |
| JP | 64-15956 | 1/1989 |
| JP | 1-209746 | 8/1989 |
| JP | 5-343634 | 12/1993 |
| JP | 6-350052 | 12/1994 |

OTHER PUBLICATIONS

Yamada et al., "An 64Mb DRAM with Meshed Power Line and Distributed Sense–Amplifier Driver," ISSCC91 Digest of Technical Papers, 1991, pp. 108–109.

Miron Abramovici et al., Digital Systems Testing and Testable Design, published by Computer Science Press, issued 1990, pp. 375–385.

Yervant Zorian et al., "An Effective BIST Scheme for Ring–Address Type FIFOs," 1994 International Test Conference, Paper 17.2, pp. 378–387.

(List continued on next page.)

Primary Examiner—David E. Graybill
(74) Attorney, Agent, or Firm—McDermott, Will & Emery

(57) ABSTRACT

An external interconnection unit including a pad provided on a semiconductor chip, a bump electrode formed on a main surface of a semiconductor chip for connection with the board, and a connection interconnection for connecting the pad and the bump electrode is provided in a plurality of stages in two rows in parallel. The bump electrode is provided on a region other than the region of a sense amplifier region (SR). A semiconductor package having reliability as a semiconductor device prevented from being degraded, and a semiconductor package effectively taking advantage of the feature of a CSP structure is provided.

50 Claims, 18 Drawing Sheets

U.S. PATENT DOCUMENTS

| | | | | |
|---|---|---|---|---|
| 4,930,000 A | | 5/1990 | Kantz | |
| 5,046,161 A | * | 9/1991 | Takada | 257/737 |
| 5,126,950 A | | 6/1992 | Rees et al. | |
| 5,216,278 A | | 6/1993 | Lin et al. | |
| 5,319,224 A | * | 6/1994 | Sahashita et al. | 257/203 |
| 5,327,013 A | * | 7/1994 | Moore et al. | 257/737 |
| 5,329,139 A | * | 7/1994 | Sanada | 257/48 |
| 5,334,873 A | * | 8/1994 | Cha | 257/738 |
| 5,365,113 A | | 11/1994 | Sakuta et al. | |
| 5,442,233 A | | 8/1995 | Anjoh et al. | |
| 5,475,236 A | * | 12/1995 | Yoshizaki | 257/48 |
| 5,514,905 A | * | 5/1996 | Sakuta et al. | 257/786 |
| 5,521,541 A | * | 5/1996 | Okamura | 257/786 |
| 5,543,633 A | * | 8/1996 | Losavio et al. | 257/48 |
| 5,543,651 A | * | 8/1996 | Sato | 257/786 |
| 5,594,279 A | | 1/1997 | Itou et al. | |
| 5,604,379 A | * | 2/1997 | Mori | 257/737 |

OTHER PUBLICATIONS

Hiroki Koike et al., "A BIST Scheme Using Microprogram ROM for Large Capacity Memories," 1990 International Test Conference, Paper 36.1, pp. 815–822.

T. Takeshima et al., "A 55ns 16 Mb DRAM," ISSCC89 Digest of Technical Papers, FAM 16.5, 1989, pp. 246–247.

Asakura et al., "A 34ns 256 Mb DRAM with Boosted Sense–Ground Scheme," ISSCC94 Digest of Technical Papers, TA 8.2, 1994, pp. 140–141.

Houghten, Jonathan L., "Plastic Ball–Grid Arrays Continue to Evolve", Electronic Design, PIPS Special Editorial Feature, Feb. 6, 1995, pp. 141–146.

Chien et al., "The Signal Transmission Characteristics of Embedded Microstrip Transmission Lines Over a Meshed Ground Plane in Copper/Polyimide Multichip Module", IEEE, Nov. 1994, vol. 17, No. 4, pp. 578–583.

Soane, David S., "Stresses in Packaged Semiconductor Devices", Solid State Technology, May 1989, pp. 165–168.

Arimoto et al., "An Effect of Filler–Induced Stress on DRAM Sense Amplifiers", IEEE, Feb. 1987, vol. ED–34, No. 2, pp. 361–366.

Yasunaga et al., "Chip Scale Package: A Lightly Dressed LSI Chip", Sep. 1995, vol. 18, No. 3, pp. 451–457.

* cited by examiner

BUMP PAD

SOLDER BUMP
CONNECTED TO PAD

SOLDER BUMP NOT
CONNECTED TO PAD

SEMICONDUCTOR CHIP SCALE PACKAGE AND BALL GRID ARRAY STRUCTURES

BACKGROUND OF THE INVENTION

1. Field of the Invention

The present invention relates to semiconductor packages of CSP (Chip Scale Package) and BGA (Ball Grid Array) structures of a high chip occupying rate and improved in packaging density, and more particularly, to a semiconductor package of a CSP structure and a BGA structure in which reliability as a semiconductor device is prevented from being degraded.

2. Description of the Background Art

A semiconductor package of a CSP structure has been developed as one that can have a high chip occupying rate (more than 90%) and that can have packaging density improved drastically. Such a package is released in, for example, ISSCC (International Solid-State Circuits Conference) 94.

As shown in FIG. 30, a semiconductor package of a CSP structure (referred to as CSP hereinafter) includes a semiconductor chip 1, a connection interconnection 3, a bump electrode 4, and a mold resin 5. Semiconductor chip 1 includes an integrated semiconductor device, and a bonding pad (referred simply as "pad" hereinafter) 2 electrically connected to the integrated semiconductor device. Pad 2 is connected to bump electrode 4 via interconnection 3 formed by photolithography. Mold resin 5 covers the entirety thereof except for the head of bump electrode 4. This semiconductor package of a CSP structure is mounted on a predetermined board by fusing bump electrode 4.

Since connection interconnection 3 and bump electrode 4 are formed on semiconductor chip 1 in a CSP, lead pins and wires connecting a lead pin and a pad of a semiconductor chip required in conventional packages do not have to be provided. This eliminates the need of a thick mold that was required to cover the lead pins and wires. Therefore, the thickness of the mold can be reduced significantly. In effect, a CSP allows a package of substantially the same size of a semiconductor chip.

Since interconnection 3 is formed by photolithography, the length and path configuration of connection interconnection 3 can be set arbitrarily. Connection between bump electrode 4 and pad 2 can be implemented easily even when bump electrode 4 and pad 2 are formed at arbitrary positions. Furthermore, wire inductance and input capacitance can be increased to improve electric characteristics by forming interconnecting 3 so that the length between bump electrode 4 and pad 2 is reduced.

FIG. 31 shows a CSP in which connection interconnection 3 is provided with pad 2 arranged at an arbitrary position. As shown in FIG. 31, respective pads 2 are formed at arbitrary positions connected to corresponding bump electrodes 4 by connection interconnection 3 formed vertically and horizontally by photolithography.

As shown in FIG. 31, a CSP can have pad 2, connection interconnection 3 and bump electrode 4 formed on arbitrary positions on a semiconductor chip 1. In forming bump electrode 4 and in mounting the CSP on a board, stress is exerted onto the semiconductor element provided under bump electrode 4. It was therefore necessary to take care that the stress generated in forming bump electrode 4 and in mounting CSP on a board is as low as possible.

The advantage of forming pad 2 or the like at an arbitrary position on semiconductor chip 1 in the CSP was used just for connecting pad 2 with bump electrode 4 by connection interconnection 3 as shown in FIGS. 30 and 31.

In a semiconductor memory such as a DRAM (Dynamic Random Access Memory), the chip area is increased as the capacity thereof becomes greater. However, the demand for increase in speed and reduction in consumption power is insatiable. Increase in the length of the wiring path on a chip due to a larger chip area results in a greater delay in signal transmission to prevent high speed operation.

Furthermore, there is a greater demand for a x16/x32/x64 configuration than a x1/x4/x8 configuration as to the number of data input/output pins corresponding to a multi-bit structure requirement. Increase in the number of bits will require a greater number of output buffers and bonding pads, which in turn will result in a larger chip area. Also, the problem of a power supply noise becomes noticeable.

Furthermore, there is a trend towards a system chip incorporating both memory and logic. Corresponding packaging technology is therefore required.

SUMMARY OF THE INVENTION

An object of the present invention is to provide a semiconductor package having a bump electrode arranged taking into consideration stress exerted on an underlying semiconductor element so as to prevent reduction in reliability as a semiconductor device.

Another object of the present invention is to provide a semiconductor package effectively taking advantage of the feature of a CSP.

A further object of the present invention is to provide a semiconductor package that can maintain high speed operation even in a semiconductor memory of a great capacity.

Still another object of the present invention is to provide a semiconductor package that can have increase in chip area and power supply noise suppressed even when the number of bits is increased.

A semiconductor package of the present invention includes features set forth in the following on the postulation that it is a semiconductor package including a plurality of external interconnection units formed of a bump electrode for connection with the outside world, on a main surface of a semiconductor chip having an integrated semiconductor device, a pad formed at the semiconductor chip for connection with the integrated semiconductor device, and a connection interconnection formed on the main surface of the semiconductor chip by photolithography for electrically connecting a pad and a bump electrode.

When an integrated semiconductor device includes a fragile circuit that is easily altered in circuit characteristics by an external factor such as mechanical stress, a semiconductor package according to an aspect of the present invention has a bump electrode formed at a region other than the upper portion of the region where the fragile circuit is provided.

Due to this arrangement, mechanical stress is prevented from being exerted on the fragile circuit via the bump electrode in the semiconductor package of the present aspect.

Preferably, the fragile circuit is a sense amplifier circuit formed of a pair of transistors for sensing and amplifying a small potential difference between a pair of bit lines.

By a virtue of the fragile circuit being a transistor circuit, imbalance in the operation characteristics of the transistor pair due to mechanical stress being exerted via the bump electrode is prevented. Therefore, reduction in the sense operation of the sense amplifier circuit can be prevented.

Preferably, the fragile circuit is an analog circuit operating at a small current.

By virtue of the fragile circuit being an analog circuit, deterioration of the operation of the analog circuit due to mechanical stress being exerted via the bump electrode is prevented.

A semiconductor package according to another aspect of the present invention includes at least one power supply pad, and a power supply interconnection. The power supply pad is provided on a main surface of the semiconductor chip to supply power to an integrated semiconductor device. The power supply interconnection is connected to the power supply pad and is provided so as to surround at least a portion of each of the plurality of external interconnection units.

By virtue of the above-described arrangement, an external interconnection unit surrounded by a power supply interconnection is electrically shielded to be immune from another external internal connection unit and to prevent electrical influence to another external interconnection unit.

Preferably, the power supply interconnection surrounding at least a portion of each of the plurality of external interconnection units is formed in a mesh-like manner connected to each other. A plurality of power supply pads are provided with respect to the mesh-like power supply interconnection so as to reduce the power supply impedance.

By virtue of this arrangement, load of the power supply can be reduced.

Preferably, a stress relaxing material is provided right beneath the bump electrode and between the connection interconnection and the main surface of the semiconductor chip for relaxing mechanical stress exerted on the semiconductor chip via the bump electrode. By virtue of this arrangement, mechanical stress is prevented from being exerted on the integrated semiconductor device.

A semiconductor package according to a further aspect of the present invention has an integrated semiconductor device including an input/output buffer circuit directly connected to a pad. The bump electrode electrically connected to the input/output buffer circuit via the pad is provided above the proximity of the input/output buffer circuit.

By virtue of this arrangement, the interconnection path from the bump electrode and the input/output buffer circuit can be shortened to prevent delay in signal transmission therebetween. Therefore, high speed operation can be maintained even when the capacity of a semiconductor memory or the like is increased. Furthermore, "address set up" and "hold margin" can be improved due to the reduction of the interconnection path length.

Preferably, the integrated semiconductor device includes a plurality of memory mats, and a master peripheral circuit that divides the plurality of memory mats and controls a memory mat independently. The memory mat includes a plurality of memory regions having a memory element, and a local peripheral circuit dividing the plurality of memory regions and controlling the memory element in each memory region independently.

The integrated semiconductor device has the so-called hierarchical memory structure. Thus, a semiconductor memory of a hierarchical memory structure that can maintain high speed operation even when the capacity is increased can be obtained.

Preferably, a second connection interconnection formed on the main surface of the semiconductor chip is further provided. The master peripheral circuit and the local peripheral circuit are electrically connected by this second connection interconnection.

The second connection interconnection is formed on the main surface of the semiconductor chip. Since elements and circuits are not formed on the main surface of the semiconductor chip, a large line width of the second connection interconnection can be ensured. A material suitable for interconnection can be selected since restriction with respect to the material of the second interconnection is not severe. Therefore, the impedance of the second connection interconnection can be reduced, which in turn allows reduction of the time constant and prevents delay in signal transmission.

Preferably, a bump electrode through which a signal transmitted to each of the plurality of memory mats is entered by the master peripheral circuit is formed on the region where the master peripheral circuit is provided. Each of the plurality of memory mats is arranged so as to be symmetrical with respect to the position of the bump electrode. The interconnection from a bump electrode to the plurality of memory mats is arranged so as to be symmetrical with respect to the position of bump electrode.

By virtue of this symmetrical arrangement, each interconnection from a bump electrode to respective memory mats can be arranged so as to be symmetrical with respect to the bump electrode. An input signal is first entered into the master peripheral circuit that controls each memory mat. Therefore, the transmission distance of a signal from a bump electrode to each of the plurality of memory mats is substantially identical. As a result, phase offset of a signal applied to each memory mat, i.e. the skew, can be reduced significantly.

Preferably, the transmission distance of an input signal from a bump electrode to each of the plurality of memory mats is substantially identical.

Due to this arrangement, the skew for each memory mat can be reduced.

Preferably, an output bump electrode for providing an output signal from a memory element to the outside world is electrically connected to an output buffer provided within a region of the local peripheral circuit. This output bump electrode is arranged on a region where the local peripheral circuit is provided.

The output bump electrode can be arranged in the proximity of the output buffer circuit arranged on a local peripheral circuit region. Therefore, delay of an output signal from an output buffer circuit to a bump electrode can be prevented.

Preferably, the connection interconnection includes first and second connection interconnections electrically insulated from each other, and extending at different levels on the main surface of the semiconductor chip.

By virtue of the first and second connection interconnections extending at different levels, the degree of freedom of the arrangement of the connection interconnection can be increased in comparison with the case where the first and second interconnections are formed on the same level. Therefore, various interconnection structures can be accommodated while maintaining electrical insulation of the first and second connection interconnections.

Preferably, the connection interconnection includes first and second connection interconnections extending on the same level on a main surface of the semiconductor chip. At the crossing of the first and second connection interconnections, the electrical insulation state of the first and second connection interconnections is maintained by one of the first and second interconnections being electrically connected to a conductive layer formed in the semiconductor chip.

Since the first and second connection interconnections extending on the same level can have their insulation state maintained by using a conductive layer in a semiconductor chip, it is easy to comply with various interconnection structures.

Preferably, a power supply bump electrode for supplying power supply to the output buffer circuit is arranged on a region where the local peripheral circuit including the output buffer circuit is provided.

By virtue of this arrangement, power can be supplied from the bump electrode to the output buffer circuit through a short interconnection path. Therefore, a low impedance power supply of low noise can be realized.

Preferably, an output bump electrode electrically connected to each of the plurality of memory elements in a memory region and electrically connected to a data bus for data input/output with the plurality of memory elements is arranged on and in the proximity of the memory region.

By virtue of this arrangement, the data bus can be shortened. Therefore, access will not be degraded even when the number of bits is increased.

Preferably, the master peripheral circuit includes a mat select circuit that selects and renders operable one of the plurality of memory mats, and that inhibits supply of power towards a local peripheral circuit within a non-selected memory mat.

A particular mat can be selected to be rendered operable by the mat select circuit. Since power supply towards the local peripheral circuit is inhibited by a mat select circuit for a non-selected mat, consumption power can be reduced in comparison with the case where a predetermined voltage is applied to a non-selected mat to set a standby state thereof.

Preferably, the master peripheral circuit includes a mat select circuit for selecting and rendering operable a predetermined number of memory mats, and inhibiting power supply into the local peripheral circuit of the non-selected memory mat.

Since the number of memory mats to be selected can be varied according to the mat select circuit, the number of bits can be changed according to the selected number of memory mats. Therefore, the memory size can be set as a variable module. Furthermore, consumption power can be reduced since power supply towards a local peripheral circuit in a non-selected memory mat is prevented by the mat select circuit.

Preferably, a power supply conductive layer for supplying a power supply voltage to elements within the integrated semiconductor device is formed within the semiconductor chip. The connection interconnection to which power supply voltage from the bump electrode is provided extends in a direction crossing the direction of extension of the power supply conductive layer, and is electrically connected to the power supply conductive layer.

By electrically connecting the connection interconnection to the power supply conductive layer, the potential of the power supply conductive layer can be enhanced.

Preferably, the element is a sense amplifier circuit formed of a transistor pair for sensing and amplifying a small potential difference between a bit line pair. The connection interconnection and the power supply conductive layer are arranged so as to be mesh-like in plane.

Since the potential of the power supply conductive layer connected to the sense amplifier circuit is enhanced, a stable operation of the sense amplifier circuit can be achieved.

Preferably, the semiconductor chip includes a test pad for testing brought into contact with a probe needle of a prober in a testing mode. The test pad is provided at the main surface of the semiconductor chip, and is formed on a region other than where the integrated semiconductor device is formed.

The semiconductor chip allows wafer testing by a prober since it includes a pad for testing.

Preferably, an oscillator activated by an external test signal, and a control signal generator for generating various control signals by the oscillator are further provided for a test mode operation. The control signal generator is connected to the master peripheral circuit so that a signal provided from the control signal generator is applied to the master peripheral circuit.

Since a control signal such as RAS and CAS of each address signal and test patterns can be generated in the semiconductor chip by an external test signal, the number of pads for testing can be reduced in comparison with the case where these signals are externally applied to the semiconductor chip.

Preferably, a shift register is further provided for sequentially storing the pass/fail state of test data obtained from each of the plurality of memory mats and sequentially providing the stored pass/fail state of test data.

Preferably, a signal indicating the pass/fail state of test data provided from a shift register is output from the test pad provided in the semiconductor chip.

The pass/fail state of a plurality of test data can be sequentially output to one output pad by the shift register. Therefore, the number of pads required for testing in the semiconductor chip can be reduced.

Preferably, a test pad and a pad are electrically connected to the local peripheral circuit by different interconnection paths. The first interconnection between the test pad and the local peripheral circuit can be switched between a connected and non-connected state. Also, the second interconnection between the pad and the local peripheral circuit can be switched between a connected and non-connected state. In a test mode, the first interconnection attains a connected state, and the second interconnection attains a non-connected state. In a normal operation mode, the first interconnection attains a non-connected state, and the second interconnection attains a connected state.

Since the connection/non-connection of the first and second interconnections can be selected, the test pad can be electrically connected to the local peripheral circuit in a testing mode, and the pad can be electrically connected to the local peripheral circuit in a normal operation mode.

Preferably, a circuit for determining and storing a defective address of a memory element from the pass/fail of test data obtained from each memory mat is further provided. A signal of a defective address is sequentially output from this circuit.

Preferably, a signal of a defective address provided from the circuit that determines and stores a defective address is output from the test pad provided in the semiconductor chip.

The defective address can be output as a packet by the circuit that determines and stores the defective address of a memory element.

Preferably, the power supply interconnection is provided on the main surface of the semiconductor chip so as to surround the interconnection to which a predetermined potential is applied. This power supply interconnection is formed so that current is not conducted.

Due to this arrangement, the interconnection is electrically shielded to be electrically immune from another external interconnection unit and to prevent electrical influence on another external interconnection unit.

Preferably, a plurality of bump electrodes are arranged separated from each other and so as to be exposed from the surface of the entire semiconductor package.

Preferably, the plurality of bump electrodes include a bump electrode which is not electrically connected to a pad.

By virtue of a plurality of bump electrodes formed all over the surface of the semiconductor package, heat radiation of the semiconductor package can be improved. Therefore, the heat resistance can be lowered.

Preferably, a plurality of bump electrodes are also arranged on the back side of the semiconductor package, spaced apart from each other.

By forming bump electrodes also on the back surface, heat radiation of the package can further be improved to reduce heat resistance.

Preferably, a comparator that selects a predetermined number of memory elements from a memory mat to determine match/mismatch of logic of the predetermined number of memory elements, and providing the determination result is connected to only one of the plurality of memory mats.

Since the transmission distance of a signal applied to each of the plurality of memory mats from a bump electrode is substantially equal, the access time towards these mats is also substantially identical. By providing a comparator in only one memory mat and measuring the access time of that memory mat, measurement of the access time period for other memory mats can be omitted. In other words, the so-called I/O false degeneration test is allowed.

A semiconductor package according to still another aspect of the present invention includes a semiconductor chip having an integrated semiconductor device. The integrated semiconductor device includes a plurality of memory mats, and a master peripheral circuit that divides the plurality of memory mats and controls a memory mat independently. A memory mat includes a plurality of memory elements. A circuit for determining and storing a defective address of a memory element from the pass/fail state of test data obtained from each of the plurality of memory mats in a test mode is also provided. A signal of a defective address is sequentially output from this circuit.

By virtue of this circuit for determining and storing a defective address of a memory element, a defective address can be output in a packet.

A semiconductor package according to yet a further aspect of the present invention includes a plurality of external interconnection units formed of a bump electrode on a main surface of a semiconductor chip with an integrated semiconductor device for connection with the outside world, a pad formed on the semiconductor chip for connection with the integrated semiconductor device, and a connection interconnection formed on the main surface of the semiconductor chip by photolithography for electrically connecting a pad and a bump electrode. A power supply interconnection is provided on the main surface of the semiconductor chip so as to surround a connection interconnection to which a predetermined potential is applied. This power supply interconnection is provided so that current is not conducted.

By virtue of this arrangement, this connection interconnection is electrically shielded and is electrically immune to another external interconnection unit and prevents electrical influence to another external interconnection unit.

A semiconductor package according to yet a still further aspect of the present invention includes a pad on a main surface of a semiconductor chip with an integrated semiconductor device. The integrated semiconductor device includes a plurality of memory mats, and a master peripheral circuit dividing the plurality of memory mats and controlling a memory mat independently. A memory mat includes a plurality of memory elements. Each of the plurality of memory mats is arranged so that the transmission distance of a signal applied to each of the plurality of memory mats from a pad is substantially equal. A comparator selecting a predetermined number of memory elements from a memory mat for determining match/mismatch of logic of the predetermined number of memory element and providing the determination result is connected to only one of the plurality of memory mats.

Since the transmission distance of the signal applied to each of the plurality of memory mats from a bump electrode is substantially equal in the semiconductor package, the access time towards these mats is also identical. Therefore, by providing a comparator to one memory mat and measuring the access time of that memory mat, measurement of the access time of the other memory mats can be omitted. In other words, the so-called I/O false degeneracy testing is allowed.

In a semiconductor package according to another aspect of the present invention including a plurality of external interconnection units formed of a bump electrode provided on a main surface of a semiconductor chip including an integrated semiconductor device for connection with an external terminal, a pad formed at the semiconductor chip for connection with the integrated semiconductor device, and a connection interconnection for electrically connecting the pad and the bump electrode, the integrated semiconductor device includes a plurality of memory mats, and a master peripheral circuit for dividing the plurality of memory mats and controlling each memory mat independently. This memory mat includes a plurality of memory arrays, and a local peripheral circuit for dividing the plurality of memory arrays and controlling each memory array independently.

In a semiconductor package according to another aspect of the present invention, a bump electrode is provided for connection with an external terminal such as of a CSP structure and a BGA structure. The bump electrode can be arranged all over the surface of the semiconductor chip. This prevents increase of the size of the semiconductor package such as a QFP and prevents generation of a great capacitance between leads even in the case where hierarchical and highly integrated memories are mounted on a semiconductor package.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

As a semiconductor package according to a first embodiment of the present invention, a DRAM package of a CSP structure having a bump electrode arranged in consideration of a sense amplifier circuit formed at an underlayer will be described hereinafter.

In general, a sense amplifier circuit of a DRAM is a fragile circuit that has circuit characteristics easily altered according to an external factor such as mechanical stress exerted during manufacturing and during usage. Provision of a sense amplifier circuit right beneath a bump electrode must be avoided since mechanical stress is exerted on the bump electrode when a bump electrode is formed and in mounting the bump electrode onto the board.

Figure 1:
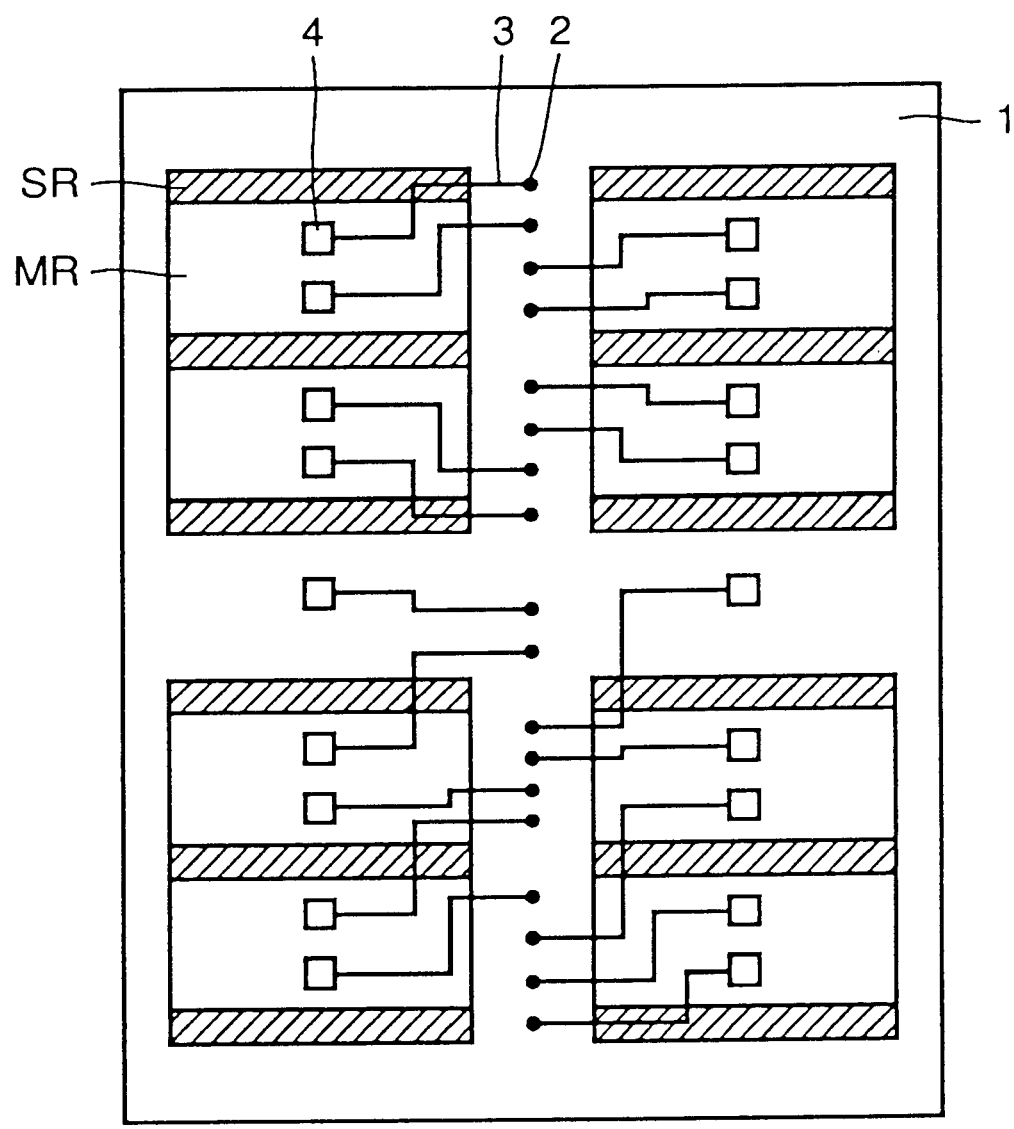
FIGS. 1 and 2 are plan views of a semiconductor package according to first and second embodiments, respectively, of the present invention.

FIG. 1 shows the positioning relationship of a sense amplifier circuit and a bump electrode of a DRAM package of a CSP structure.

Referring to FIG. 1, a plurality of pads 2 connected to various input/output terminals incorporated in semiconductor chip 1 are provided on a main surface of semiconductor chip 1. A structure for connection with the outside world formed of pad 2, a bump electrode 4 for connection with the board, and a connection interconnection 3 connecting pad 2 and bump electrode 4 (referred to as "external interconnection unit" hereinafter) is provided in a plurality of stages in two rows parallel to each other.

Here, semiconductor chip 1 includes a sense amplifier circuit. The region where the sense amplifier circuit is provided is labeled as sense amplifier region SR. The region where a memory cell is provided is labeled as memory cell region MR. Although sense amplifier region SR and memory cell region MR are covered with an insulation layer or the like and cannot be seen, positions thereof are indicated by solid lines for the sake of convenience.

As shown in FIG. 1, bump electrode 4 is not provided above sense amplifier region SR. Bump electrode 4 is mainly formed in memory cell region MR. Pad 2 is formed on a region other than sense amplifier region SR.

Figure 4:
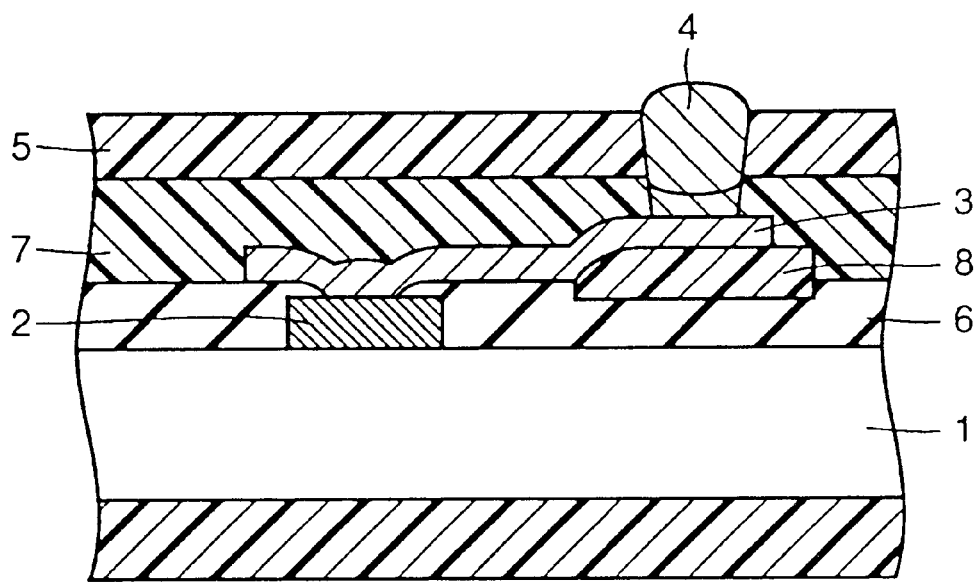
FIG. 4 is a partial sectional view of a semiconductor package according to a third embodiment of the present invention.

By virtue of bump electrode 4 being formed at an arbitrary position on a region other than sense amplifier region SR and connection interconnection 3 being arranged to take an arbitrary path by photolithography, a structure as shown in FIG. 4 can be obtained.

Since the sense amplifier is a circuit formed of a pair of transistors that senses and amplifies a small potential difference between bit lines, this structure prevents imbalance in the operating characteristics of the transistor pair caused by mechanical stress exerted thereon. Therefore, reduction in a sense operation can be prevented.

The same apply to the case where semiconductor chip 1 includes a circuit that operates at a small current, for example, an analog circuit such a current mirror circuit which is a constant current source. A structure is provided in which bump electrode 4 is not formed on a region where an analog circuit is formed.

Second Embodiment

An example of a CSP taking advantage of the feature that a pad, a connection interconnection, and a bump electrode can be provided on arbitrary positions on a semiconductor chip will be described hereinafter as a semiconductor package of the second embodiment.

Figure 2:
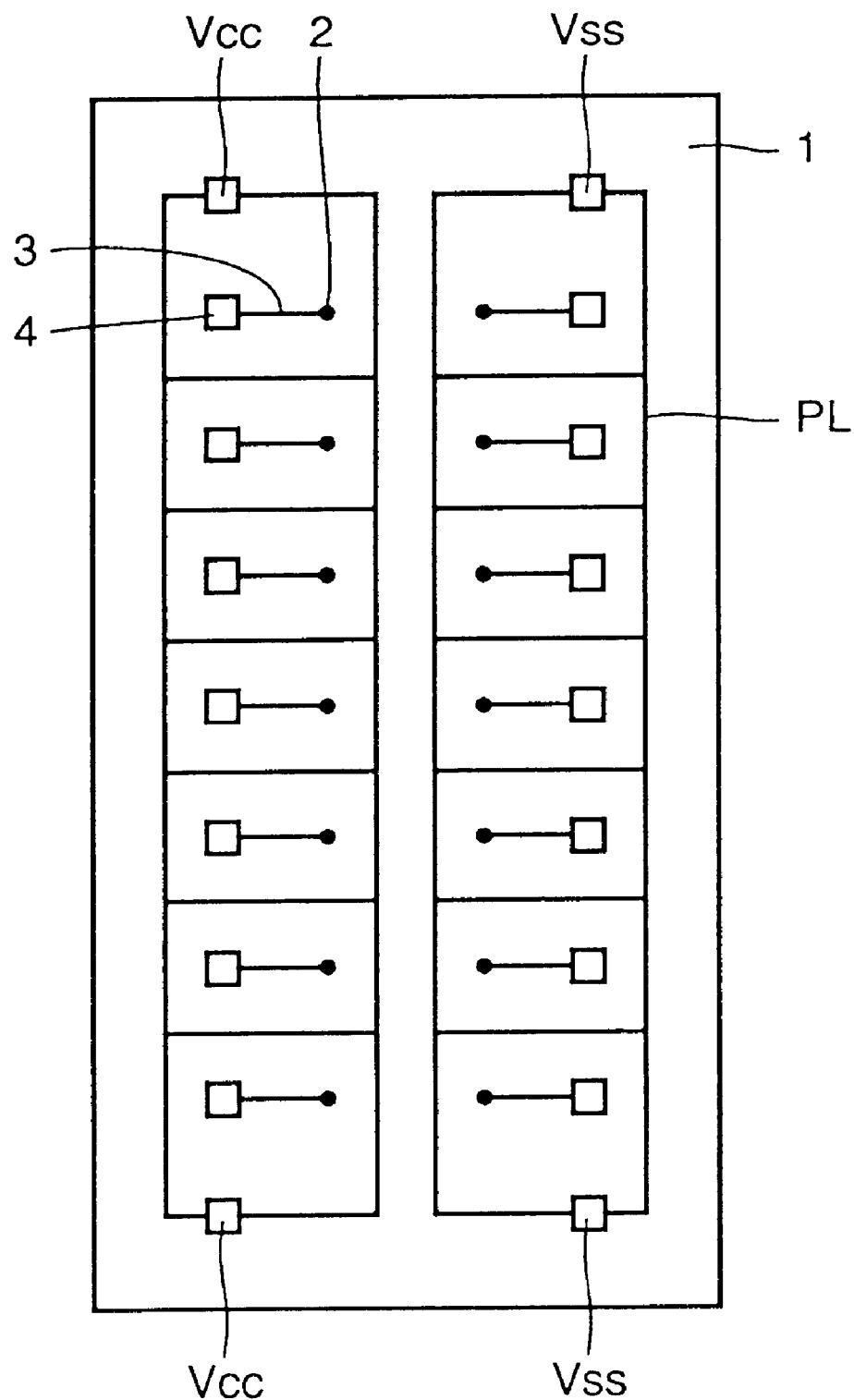

Referring to FIG. 2, a pad 2 connected to various input/output terminals built in semiconductor chip 1 is formed on a main surface thereof. An external interconnection unit including pad 2, bump electrode 4 for connection with the board, and connection interconnection 3 for connection between pad 2 and bump electrode 4 is provided in a plurality of stages in two rows parallel to each other. A power supply interconnection PL is provided in a mesh manner so as to surround each external interconnection unit.

In FIG. 2, the mesh interconnection is divided into a mesh that is connected to a power supply potential pad Vcc supplying a power supply voltage, and a mesh connected to a ground potential pad Vss of a power supply potential. Since power supply interconnection PL is provided taking advantage of the feature of a CSP that an arbitrary interconnection path can be formed by photolithography, the interval and configuration of the mesh can be set arbitrarily.

Various input/output terminals built inside semiconductor chip 1 are electrically shielded by enclosing each external interconnection unit with power supply interconnection PL. Therefore, noise can be reduced between adjacent clock terminals.

It is appreciated from FIG. 2 that the wire inductance can be reduced due to a shorter interconnection 3 by forming bump electrode 4 in the proximity of pad 2. Therefore, the problem of ringing in a data output terminal can be improved.

By forming power supply interconnection PL in a mesh manner, power supply pad Vcc and ground potential pad Vss can be provided at appropriate locations on semiconductor chip 1. As a result, power supply impedance on semiconductor chip 1 can be reduced. Therefore, the load of the power supply can be reduced in a structure of a great power supply load such as a multi-chip module in which a plurality of semiconductor packages are mounted on one board.

Although, in the structure of FIG. 2, all the external interconnection units on semiconductor chip 1 are surrounded by power supply interconnection PL, it is not necessary to surround all the external interconnection chips with power supply interconnection PL. For example, only external interconnection units that are connected to a clock terminal, a data input/output terminal, a reference voltage terminal, and the like may be selectively surrounded by power supply interconnection PL.

Furthermore, the invention is not limited to the present embodiment in which a power supply interconnection PL of a mesh configuration is connected to both power supply potential pad Vcc and ground potential pad Vss. Power supply interconnection PL may be connected to only one of pads Vcc and Vss.

Third Embodiment

In contrast to the semiconductor package of the first embodiment describing a DRAM of a CSP structure in which a bump electrode is not arranged above a sense amplifier circuit to take account of mechanical stress exerted on the bump electrode during formation of the bump electrode and during coupling between a bump electrode and the board, a semiconductor package of the present third embodiment has a CSP structure in which mechanical stress can be reduced.

Figure 3:
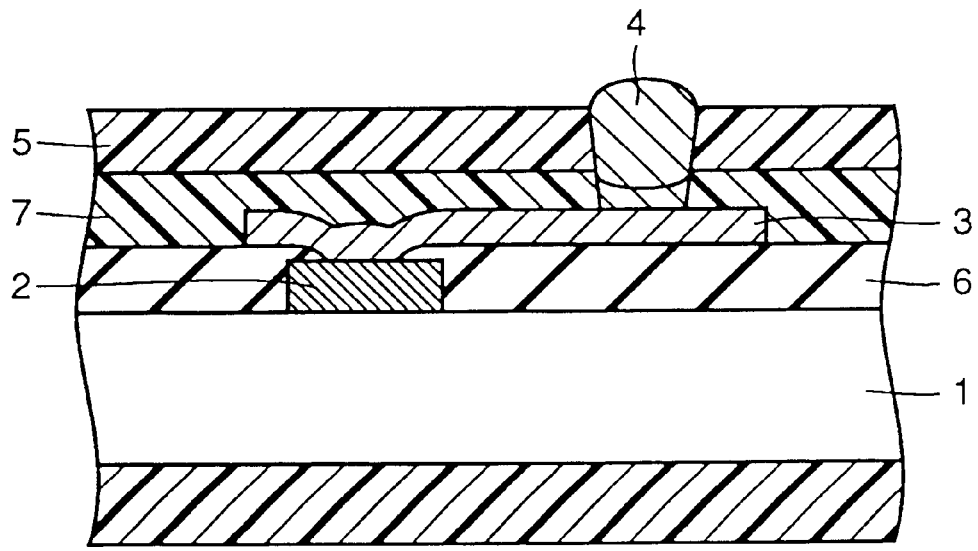
FIG. 3 is a partial sectional view of a general CSP.

Referring to FIG. 3, pad 2 is provided on substrate 1 in which an integrated semiconductor device and the like are formed. A passivation film 6 is formed all over so as to cover pad 2.

Passivation film 6 is partially not present on a main surface of pad 2. Connection interconnection 3 is provided so as to come into contact with the main surface of pad 2. Connection interconnection 3 is provided extending from the main surface of pad 2 onto the surface of passivation film 6 in a predetermined direction. A polyimide resin 7 serving as an interlayer insulation film is formed on the main surface of passivation film 6 so as to cover connection interconnection 3. A mold resin (epoxy resin) 5 is formed all over the main surface of polyimide resin 7. There is a region on connection interconnection 3 that does not have polyimide resin 7 and mold resin 5 formed thereon. Bump electrode 4 is provided at that region with a barrier metal layer therebetween.

In the CSP of the above-described structure, mechanical stress is exerted to the semiconductor chip right beneath bump electrode 4 during formation of bump electrode 4 and during mounting of bump electrode 4 onto the board. It is generally known that the transistor characteristic is altered and leakage current is induced, for example, in a semiconductor device provided in a semiconductor chip when stress is exerted thereupon.

FIG. 4 shows a partial sectional view of a CSP including a buffer coating right under bump electrode 4 for relaxing stress.

Referring to FIG. 4, a buffer coat 8 which is a stress relaxing material is selectively provided between connection interconnection 3 and passivation film 6, right under bump electrode 4. The remaining structure is similar to a general CSP shown in FIG. 3. Corresponding component have the same reference characters allotted, and their description will otherwise not be repeated.

Buffer coat 8 is formed of a material such as polyimide resin or the like. Following application of polyimide resin all over passivation film 6 by spin coating, buffer coat 8 is selectively formed by photolithography. Therefore, similar to connection interconnection 3 and pad 2, buffer coat 8 can be provided at an arbitrary position.

By the presence of buffer coat 8, mechanical stress exerted onto semiconductor chip 1 right under bump electrode 4 is relaxed during formation of bump electrode 4 and mounting bump electrode 4 on the board. Therefore, degradation of the semiconductor device characteristics caused by this mechanical stress can be prevented.

By applying the above-described CSP including buffer coat 8 to the first embodiment of FIG. 1, the sense amplifier circuit can be protected to further reduce the stress exerted upon the sense amplifier circuit. Therefore, variation in the circuit characteristics can be prevented.

Furthermore, the possibility of mechanical stress exerted on an underlying semiconductor device can be reduced by applying the present CSP including buffer coat 8 to the second embodiment of FIG. 2. Therefore, the degree of freedom in arranging a bump electrode is increased to allow power supply interconnection of a more complex level.

Fourth Embodiment

Figure 5:
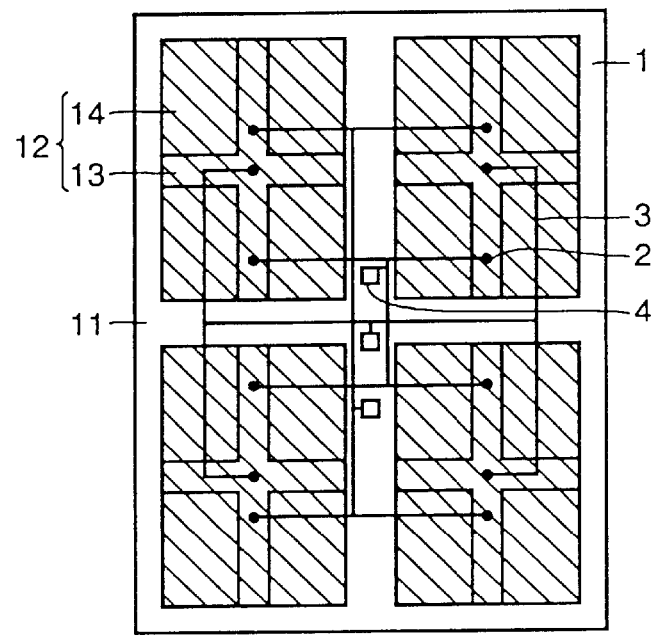
FIG. 5 is a plan view showing a semiconductor package according to a fourth embodiment of the present invention.
Figure 6:
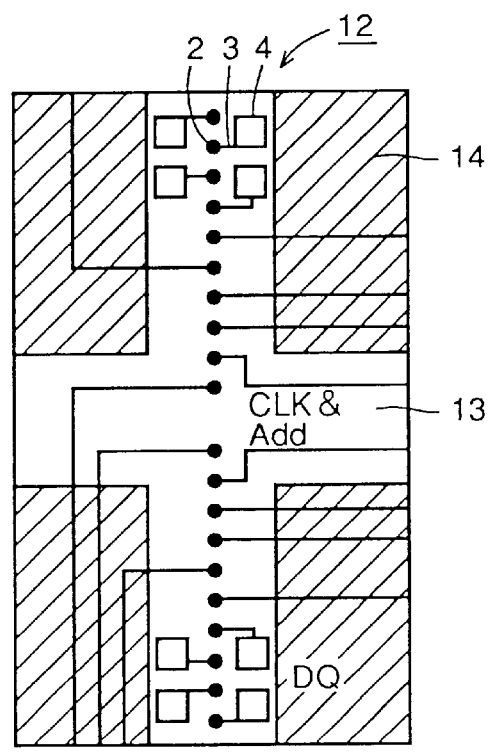
FIG. 6 is a schematic plan view of the mat of FIG. 5 shown in enlargement.

FIG. 5 shows a chip image of a DRAM of large capacity having a hierarchical structure. FIG. 6 is an enlargement of the upper left mat (hatch portion) of FIG. 5.

Referring to FIGS. 5 and 6, a semiconductor chip 1 includes four, for example, mats 12, and a master peripheral circuit 11 controlling each mat 12. Master peripheral circuit 11 is arranged crosswise between each mat 12. Each mat 12 includes a memory array 14, and a local peripheral circuit 13 for controlling a corresponding memory array 14.

An input buffer circuit (not shown) is formed within the region where master peripheral circuit 11 is formed. A bump pad 4 for input is provided that is electrically connected to the input buffer circuit via a pad and a frame interconnection (not shown). This input bump pad 4 is formed on a region in the proximity of the input buffer circuit.

Figure 7:
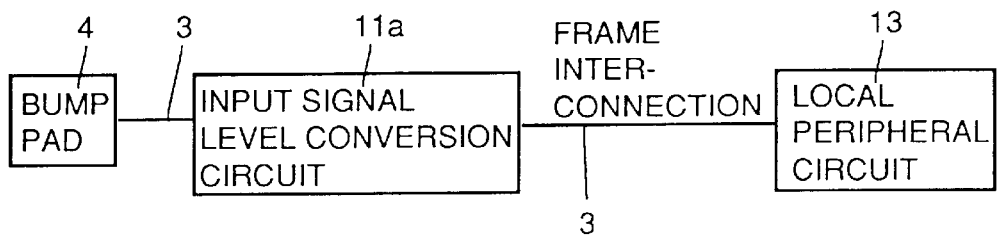
FIG. 7 is a block diagram showing connection of a bump pad to a local peripheral circuit.

As shown in FIG. 7, bump pad 4 is connected to an input signal level conversion circuit 11a within a master peripheral circuit via an input buffer circuit. Input signal level conversion circuit 11a and local peripheral circuit 13 in each mat are electrically connected by a frame interconnection 3 formed on a main surface of each semiconductor chip 1.

It is to be noted that input bump pad 4 can be directly connected to a pad with no frame interconnection.

In FIG. 6, an output buffer circuit (not shown) is provided in the region where local peripheral circuit 13 is formed. A bump pad 4 for output is electrically connected to this output buffer circuit via pad 2 and frame interconnection 3. This output bump pad 4 is formed on a region in the proximity of the output buffer circuit.

Output bump pad 4 can also be directly connected to pad 2 with no frame interconnection 3.

Signal transmission in this semiconductor package will be described hereinafter.

An externally applied input signal is provided to input bump pad 4 arranged in master peripheral circuit 11. This input signal is applied to input signal level conversion circuit 11a via an input buffer circuit in master peripheral circuit 11. The input signal is converted into a signal of an internal power supply level to be transmitted to each mat 12 as a master signal through frame interconnection 3 (corresponding to a wiring in a general package) of the CSP.

This master signal is applied to local peripheral circuit 13 arranged in the proximity of the center of each mat 12. Then, the signal is applied to memory array 14 via a local peripheral circuit.

Data provided from memory array 14 of each mat 12 is transmitted to an output buffer circuit arranged in local peripheral circuit 13 of each mat 12 by a short data bus. Output data is output by output bump pad 4 arranged on a region in the proximity of memory array 14 on each local peripheral circuit.

According to the present embodiment, bump electrode 4 is provided on a region in the proximity of an input buffer circuit or an output buffer circuit that is to be connected. Therefore, the interconnection path from bump pad 4 to an input buffer circuit or an output buffer circuit can be reduced. Therefore, delay in signal transmission between bump pad 4 and an input or output buffer circuit can be prevented. Therefore, high speed operation can be maintained even when a semiconductor memory is increased in capacity.

Since the interconnection path is shortened, address set up and hold margin can also be improved. This will be described in detail hereinafter.

Figure 8:
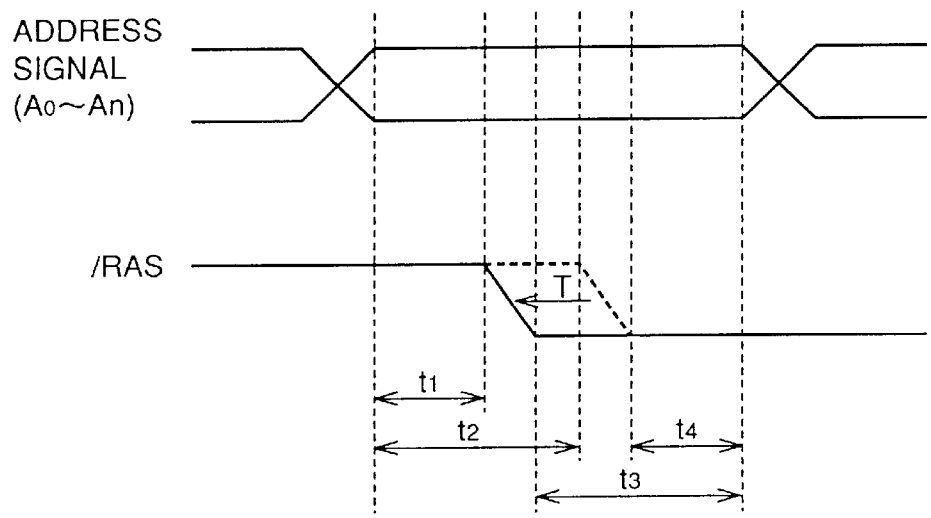
FIG. 8 shows an example of an address set up and a hold margin.

FIG. 8 exemplifies a set up time and a hold time of an address signal required for an external control signal in a data readout operation. In a DRAM, a row address signal and a column address signal are provided in a time-divisional manner. Here, only a row address signal will be described.

Referring to FIG. 8, a before-RAS row address set up time $t_2$ is defined for an address signal in order to obtain an ascertained state for a row address signal before a fall of a row address strobe signal /RAS. Also, an after-RAS row address hold time $t_4$ is defined for maintaining the row address signal after a fall of external row address strobe signal /RAS. An internal row select operation is initiated in the DRAM at the elapse of this after-RAS row address hold time $t_4$.

Since the interconnection path between a bump electrode and an input/output buffer circuit can be shortened in the present embodiment, signal transmission is reduced by time T. In other words, the fall of row address strobe signal /RAS is advanced by time T. Therefore, the before-RAS row address set up time $t_2$ is shifted to time $t_1$. In other words, the set up time is reduced. Furthermore, the after-RAS row address hold time $t_4$ is shifted to $t_3$. This means that the margin of the holding time is increased.

Figure 9:
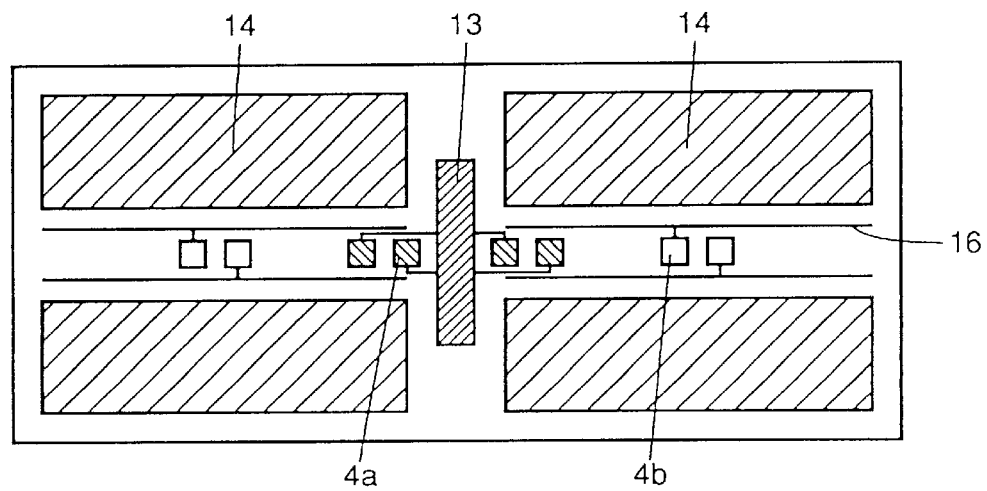
FIG. 9 is a schematic plan view showing an enlarged mat portion of FIG. 5.

In the present embodiment, output bump pad 4 can be arranged on local peripheral circuit 13. Therefore, an output buffer circuit electrically connected to output bump pad 4 can be arranged within local peripheral circuit 13 in the proximity of memory array 14. Therefore, data read out from memory array 14 of each mat 12 is transferred to an output buffer located in the vicinity through a data bus 16, as shown in FIG. 9. Therefore, access is speeded, and phase offset of each data signal, i.e. data skew is reduced. Since data bus 16 can be shortened in a multi-bit structure, access will not be degraded even when the number of bits is increased.

Each of the plurality of mats 12 is arranged symmetrically with respect to input bump pad 4 provided on a region where master peripheral circuit 11 is formed. Each interconnection extending from input bump pad 4 towards local peripheral circuit 13 of each mat 12 (including frame interconnection 3) is symmetrical with respect to input bump pad 4. More specifically, the transmission distance of a signal input from input bump electrode 4 to each of the plurality of mats 12 is substantially identical. Therefore, phase offset of the signal provided from the same input bump pad 4 to each mat 12, i.e., skew, can be reduced extremely. Control of all mats 12 from master peripheral circuit 11 can be made uniform ideally.

Most of the connection between master peripheral circuit 11 and local peripheral circuit 13 is implemented by frame interconnection 3. Frame interconnection 3 is formed on a main surface of semiconductor chip 1. Since element or circuits are not formed on the main surface of semiconductor chip 1, a great line width can be ensured for frame interconnection 3. Furthermore, a material suitable for interconnection can be selected since the restriction with respect to the material of the frame interconnection is mild. Therefore, the impedance of frame interconnection 3 can be set lower than that of an interconnection formed within a semiconductor chip. A signal can be transferred from master peripheral circuit 11 to local peripheral circuit 13 of each mat 12 with an extremely small delay time. Furthermore, the time constant can be reduced significantly since master peripheral circuit 11 and local peripheral circuit 13 are electrically connected by frame interconnection 3.

There are cases where frame interconnection 3 cross each other in FIG. 5. Insulation of each frame interconnection is ensured by the structure shown in FIGS. 10, 11 and 12. This structure will be described in detail hereinafter.

Figure 10:
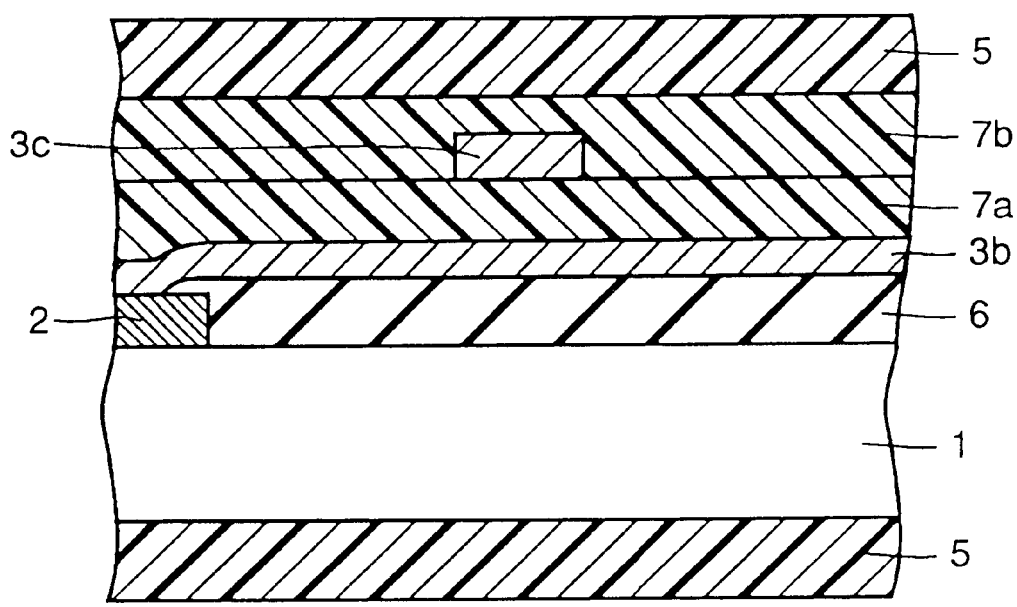
FIG. 10 is a partial sectional view of a frame interconnection layer formed on different layers.

Referring to FIG. 10, a frame interconnection 3c located at an upper layer is formed on a frame interconnection 3b of the lower layer with a polyimide resin 7a therebetween. Insulation of the two layers of frame interconnections 3b and 3c can be retained even when they cross each other in plane by forming frame interconnections 3b and 3c in different layers.

Frame interconnection 3c is covered with polyimide resin 7b.

Figure 11:
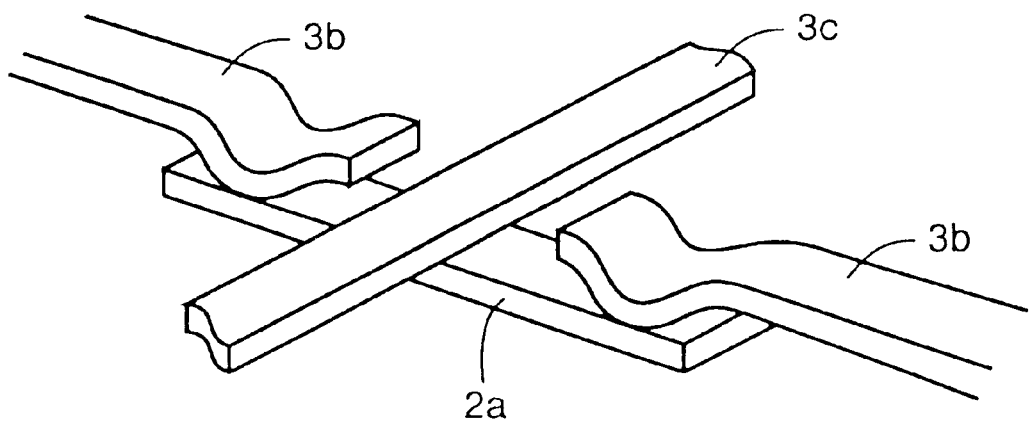
FIG. 11 is a schematic perspective view of a structure of a frame interconnection layer formed in the so-called cross under manner.
Figure 12:
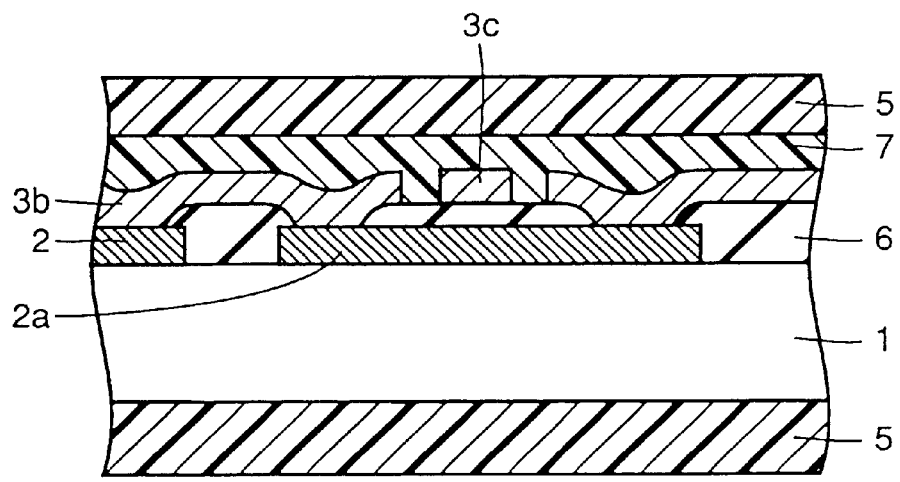
FIG. 12 is a partial sectional view showing a structure of a frame interconnection layer formed in the so-called cross under manner.

Referring to FIGS. 11 and 12, two frame interconnection 3b and 3c have a cross under structure at the crossing of frame interconnections 3b and 3c. More specifically, at the crossing of frame interconnections 3b and 3c, one frame interconnection 3b is electrically connected to interconnection layer 2a in the chip and interconnection layer 2a runs below the other frame interconnection 3c. By virtue of this cross under structure, insulation of two frame interconnections 3b and 3c is maintained even when they cross each other from the point of a plan view.

The remaining structure of FIGS. 10, 11 and 12 are similar to those shown in FIGS. 3 and 4. Therefore, corresponding components have the same reference characters allotted, and their description are not otherwise described herein.

Fifth Embodiment

Figure 13:
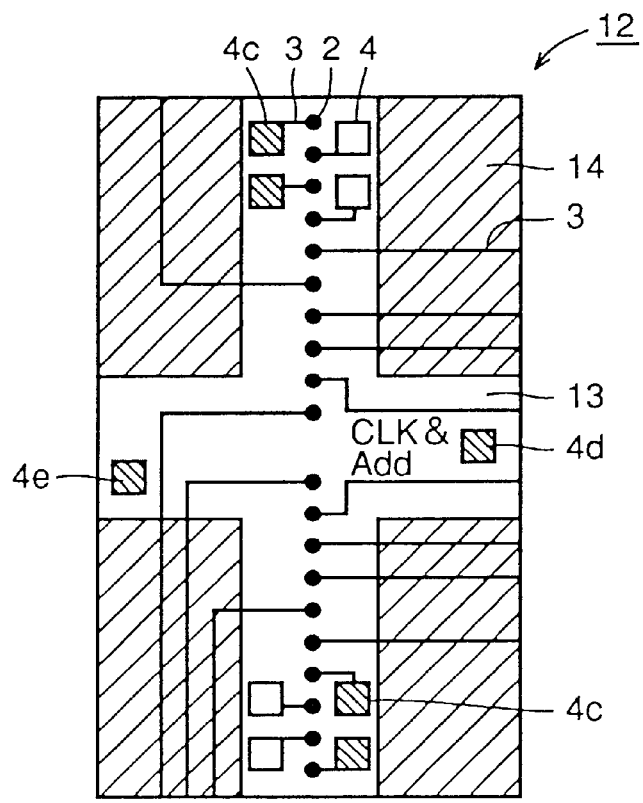
FIG. 13 is a schematic plan view showing an enlargement of a mat of a semiconductor package according to a fifth embodiment of the present invention.

As shown in FIG. 13, each mat 12 has bump pads 4c–4e that supply power supply located at arbitrary positions since there is no restriction in the arrangement of bump pads 4 by virtue of a CSP structure.

Therefore, each of power supply pads 4c–4e supplying power supply to local peripheral circuit 13 and an output buffer circuit in each mat 12 can be arranged on a region in the proximity of the output buffer circuit and the local peripheral circuit. As a result, the interconnection path between power supply pads 4c–4e and an output buffer circuit or a local peripheral circuit connected thereto can be shortened. Thus, a stable low impedance power source of low noise can be implemented.

Sixth Embodiment

Figure 14:
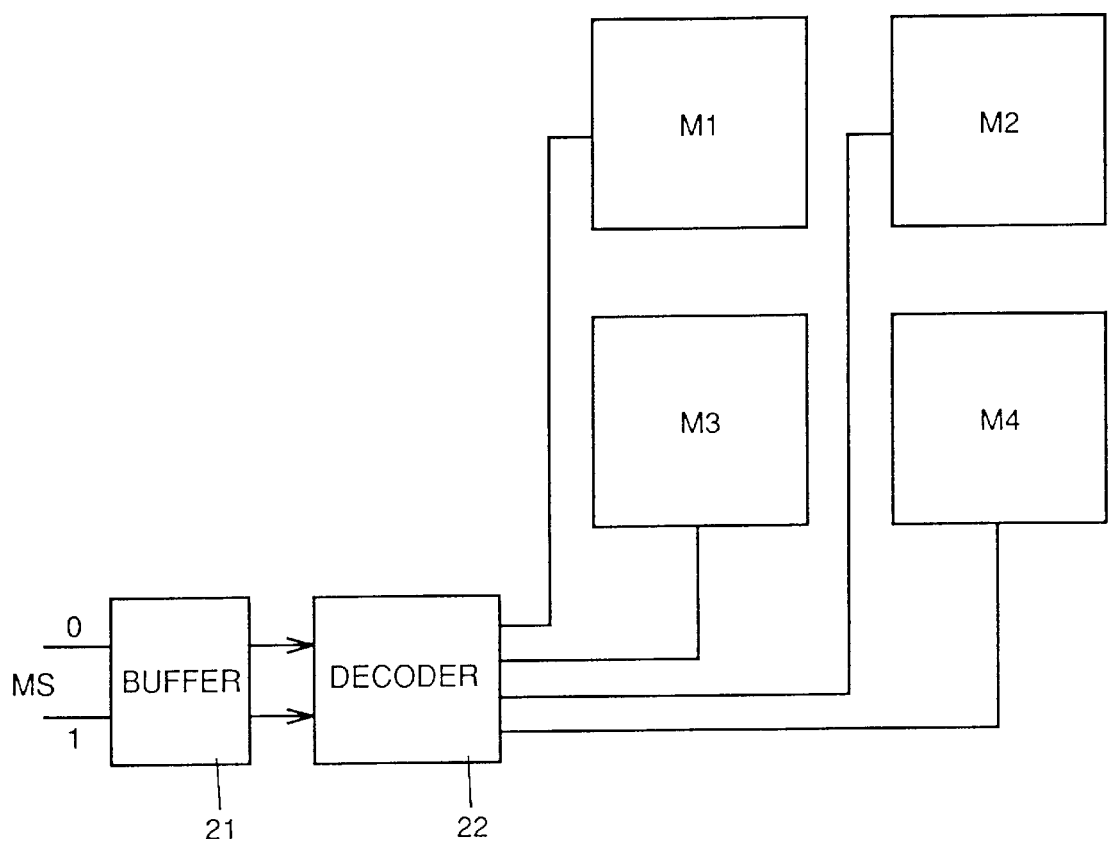
FIG. 14 is a block diagram for describing a mat select function.

FIG. 14 is a control block diagram where a decoder is used as a mat select function. Referring to FIG. 14, a decoder 22 as a mat select function is provided in the region of the master peripheral circuit in the present embodiment. A mat select signal MS is supplied to decoder 22 via an input buffer circuit 21. Each of mats M1, M2, M3, and M4 is selected by a combination of input signal MS.

Any one of mats M1, M2, M3, and M4 can be selected by mat select function 22.

Furthermore, a combination of mats M1, M2, M3 and M4 can be selected. More specifically, a variable memory configuration can be achieved by arbitrarily setting two 512 MDRAMs or four 256 MDRAMs with mat select function 22. That is to say, the memory structure can be formed of a module that has a variable bit size.

Power supply is inhibited to the local peripheral circuit of a mat that is not selected by mat select function 22. Therefore, consumption power can be reduced in contrast to the case where a predetermined voltage is applied to a non-selected mat to set a standby state.

Mat select function 22 can be implemented by providing an external mat select signal MS via a bump pad of the CSP. When a bump pad is not provided, a mat select function can be controlled by providing mat select signal MS to a frame interconnection formed on the semiconductor chip of the CSP.

Seventh Embodiment

As disclosed in ISSCC91 Digest of Technical Papers, pp. 108–109, power supply impedance can be reduced to realize a high speed sense operation by arranging a sense amplifier power supply line of the DRAM on a memory array in a mesh manner. In this case, an aluminum interconnection formed in the semiconductor chip is used for the sense amplifier power supply line arranged in a mesh manner. Furthermore, the aluminum interconnection of the lower layer (first layer) is used for the shunt of a word line, and the aluminum interconnection of the upper layer (second layer) is used for the sense amplifier power supply line and the column output line.

Since the number of sense amplifier power supply lines is increased as the integration density becomes higher in the above-described structure, the pitch of the aluminum interconnection of the second layer becomes critical. Therefore, the line width of the sense amplifier power supply line becomes smaller to cause increase in the impedance and the capacity between the column select lines. As a result, delay in signal transmission occurs.

Figure 15:
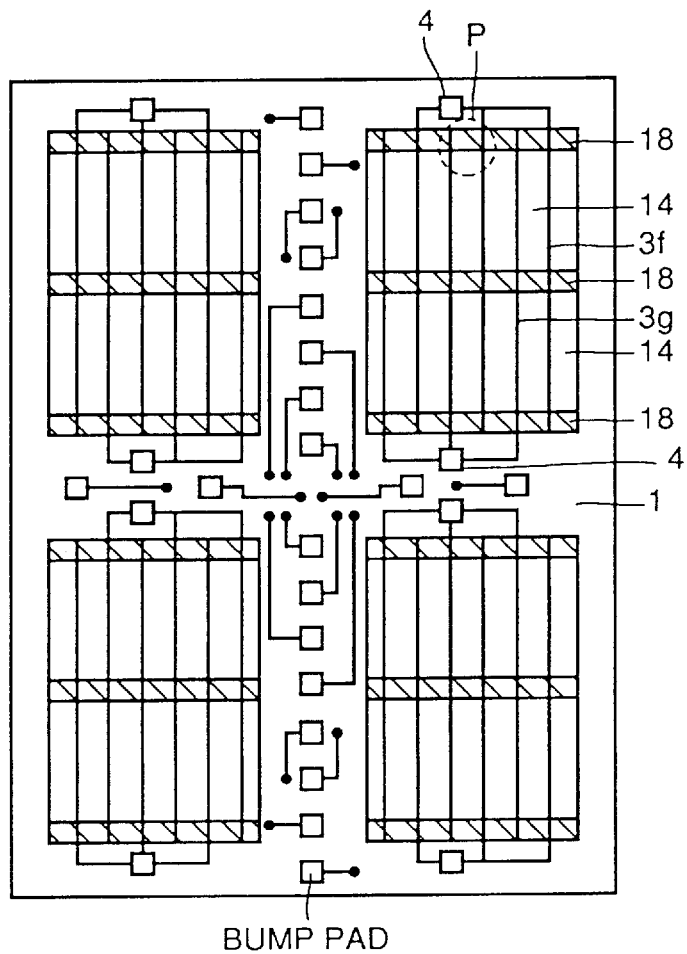
FIG. 15 is a plan view schematically showing a structure of a frame interconnection of a semiconductor package according to a seventh embodiment of the present invention.
Figure 16:
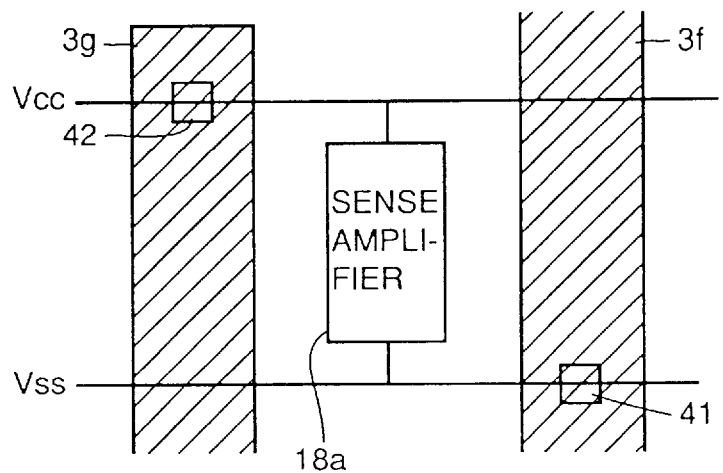
FIG. 16 is a partial plan view showing the P portion of FIG. 15 enlarged.

FIG. 15 is a plan view exemplifying an arrangement of frame interconnection in a semiconductor package according to a seventh embodiment of the present invention. FIG. 16 shows the arrangement of a frame interconnection and the Vcc and Vss power supply lines for a sense amplifier at the P portion of FIG. 15.

Referring to FIGS. 15 and 16, a power supply line formed in semiconductor chip 1 (Vcc interconnection and Vss interconnection) and frame interconnections 3f and 3g formed on a main surface of semiconductor chip 1 are arranged in a mesh manner. Frame interconnection 3f and the Vss interconnection are electrically connected at a contact 41. Frame interconnection 3g and the Vcc interconnection are electrically connected at a contact 42. Frame interconnections 3f and 3g are respectively connected to different bump pads 4. According to this arrangement, control is implemented so that a potential of Vss level is applied to frame interconnection 3f and a potential of Vcc level is applied to frame interconnection 3g.

The power supply line (Vcc and Vss interconnections) are electrically connected to a sense amplifier 18 formed within sense amplifier region 18. Sense amplifier region 18 is provided so as to be adjacent to memory array 14.

The sense amplifier power supply line (Vcc and Vss interconnections) is reinforced taking advantage of the frame interconnection of the CSP. Frame interconnections 3f and 3g are formed on a main surface of semiconductor chip 1, and no elements are formed on semiconductor chip 1. Therefore, the degree of freedom of the arrangement of frame interconnections 3f and 3g is extremely high in comparison to that of an aluminum interconnection layer and the like provided in semiconductor chip 1. Therefore, increase in the impedance of the frame interconnection layer can be suppressed even when the integration density becomes higher. Furthermore, increase in the capacity between column select lines can be also suppressed.

Figure 17:
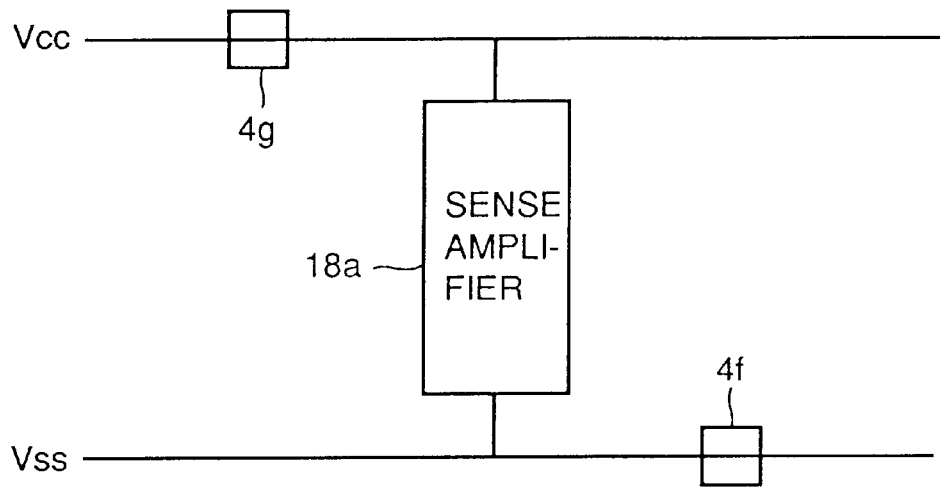
FIG. 17 is a partial plan view showing a bump pad electrically connected to a sense amplifier power supply line.

Bump pads 4f and 4g can be directly connected to each sense amplifier power supply line (Vss interconnection, Vcc interconnection) without providing a frame interconnection as shown in FIG. 17. The power supply impedance can further be reduced since a frame interconnection is omitted.

Eighth Embodiment

When a wafer process is completed, a wafer test must be carried out with no frame interconnection since a CSP process is not executed. This wafer test requires a conventional bonding pad for probing. However, provision of bonding pads for all inputs, outputs, and power supply will eliminate all the merits described in the previous embodiments in consideration of chip area.

In view of the foregoing, the present embodiment has a structure in which wafer testing can be carried out with a minimum number of bonding pads by a combination of a scan test and a BIST (Built In Self Test) used in logic (scan-BIST test). In wafer testing, only a simple test of function operation testing and DC testing is to be carried out, and testing of critical timing and the like are not required.

Details of scan testing is disclosed by, for example, Miron Abramovici et. al., Digital Systems Testing and Testable Design (published by Computer Science Press, issued 1990).

As to BIST, details are described by, for example, Yervant Zorian et. al., "An Effective BIST Scheme for Ring-Address Type FIFOS" Proceedings of 1994 International Test Conference, Paper 17.2, pp. 378–387, Hiroki Koike et. al., "A BIST SCHEME USING MICROPROGRAM ROM FOR LARGE CAPACITY MEMORIES" Proceedings of 1990 International Test Conference, Paper 36.1, pp. 815–822, and T. Takeshima et. al., "A 55ns 16 Mb DRAM" ISSCC89 Digest of Technical Papers, Vol. 32 FAM 16.5, pp. 246–247.

Figure 18:
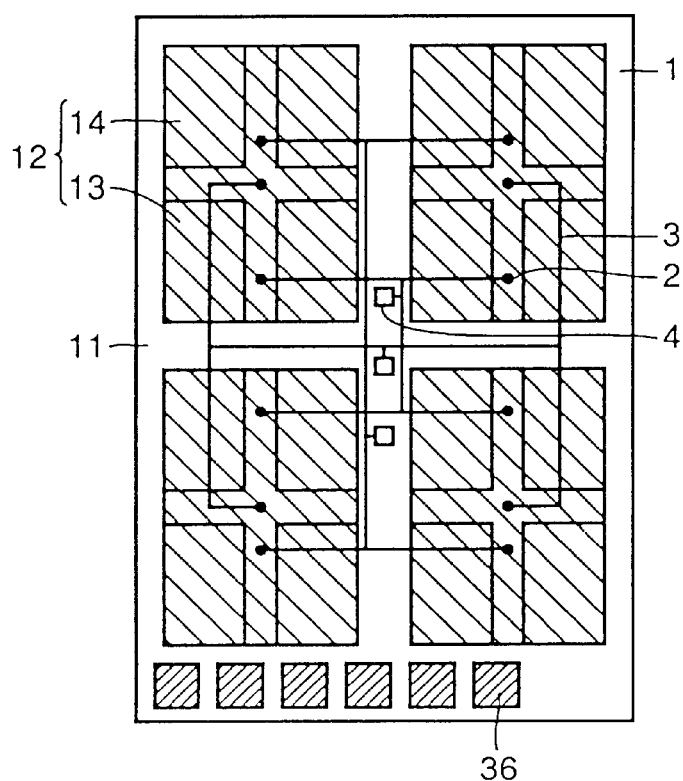
FIG. 18 is a schematic plan view showing an arrangement of bonding pads in a semiconductor package according to an eighth embodiment of the present invention.

Referring to FIG. 18, wafer testing can be carried out by at least six bonding pads 36 of Vdd, Vss, Vddq, Vssq, TE and Q in a scan-BIST test according to the present embodiment. Here, Vdd and Vss are power supplies for a peripheral circuit, Vddq and Vssq are power supplies for output buffers, TE is a signal for carrying out a scan BIST test, and Q is a flag output of the test result.

Details of wafer testing according to the present embodiment will be described hereinafter with reference to FIG. 19.

Figure 19:
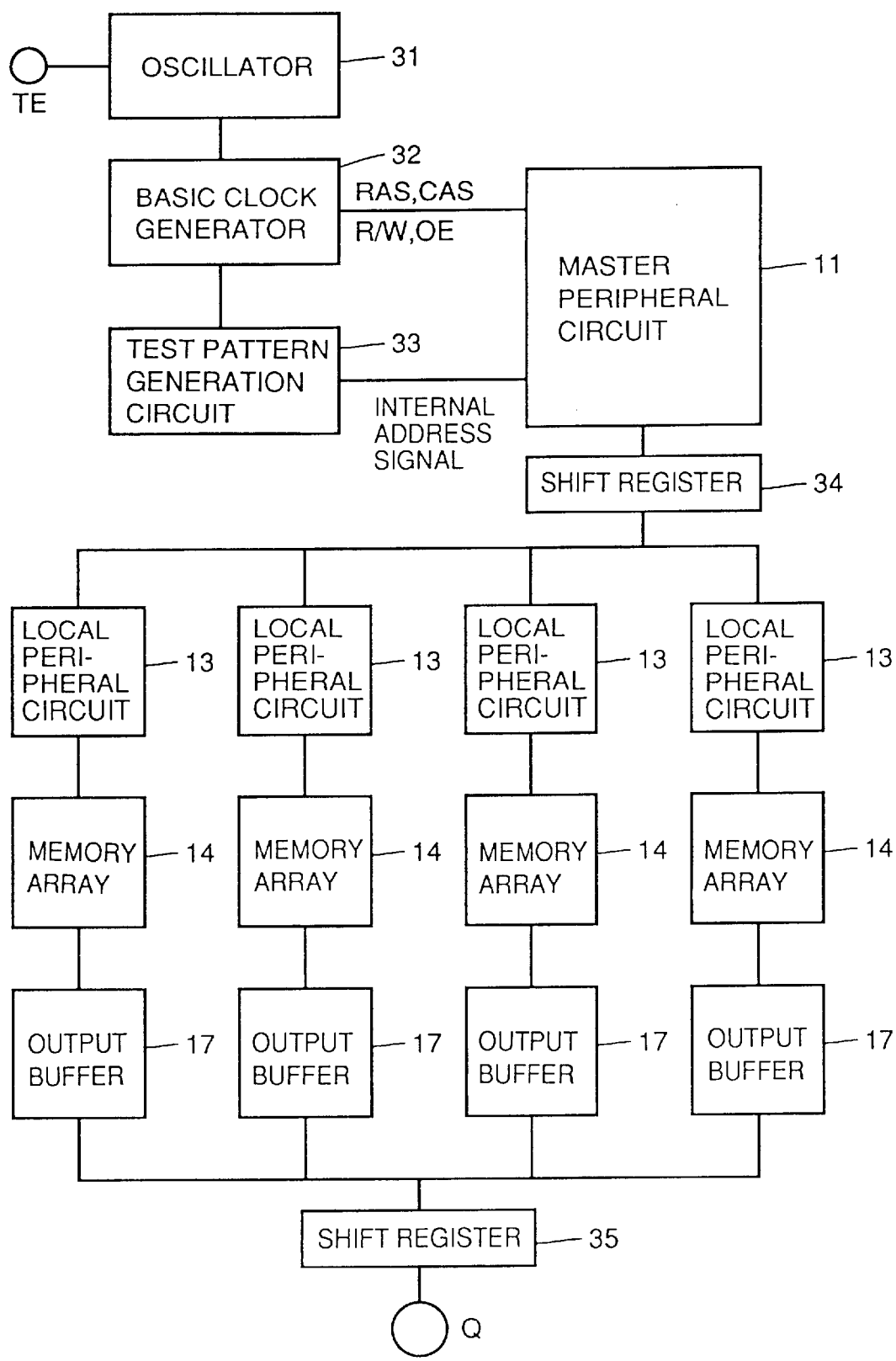
FIG. 19 is a block diagram for a describing scan/BIST testing of a semiconductor package according to the eighth embodiment of the present invention.

Referring to FIG. 19, a signal TE is applied to one bonding pad 36. Activation of signal TE causes an oscillator 31 provided inside semiconductor chip 1 to be rendered active, whereby a basic clock RAS, CAS, R/W, OE, and the like of the DRAM are generated by a basic clock generator 32. A test pattern is automatically generated by a test pattern generation circuit 33. An address is generated so as to be sequentially incremented by a counter circuit, i.e. in a sequential address number.

In response to these respective signals, a master peripheral circuit 11 is operated, then a local peripheral circuit 13 is operated, and a memory array 14 is activated to carry out a read/write operation. Match/mismatch detection between written data and readout data as to the data from memory array 14 is carried out to output a pass/fail state.

A shift register 34 functions to sequentially store both a test pattern signal and an internal address signal and to provide an output. A shift register 35 functions to sequentially store a pass/fail state of test data of each memory array 14 and to provide an output.

According to the present embodiment, a control signal is generated by basic clock generator 32, and a test pattern and an internal address signal are generated by test pattern generation circuit 33 in semiconductor chip 1. Therefore, a bonding pad for receiving these signal from the outside world can be omitted.

The pass/fail state of a plurality of test data can sequentially be provided to one output pad Q by shift register 35. The total number of bonding pads required in the semiconductor chip can be reduced since only one bonding pad 9 for providing an output of a test result is required.

In the above-described scan-BIST testing, the defective address cannot be identified. However, a defective address can be output in a packet to pad Q by a means (for example, a shift register) that determines and stores a defective address of each memory cell by receiving an internal address signal and a pass/fail state of each memory array 14. If an external record is provided, a defective address can be identified, and redundancy testing can be carried out.

In contrast to the fourth embodiment of the present invention in which a local peripheral circuit of each mat is connected with a master peripheral circuit by a frame interconnection, there is no frame interconnection at a wafer testing stage. Therefore, connection by a provisional aluminum interconnection must be provided. In this case, the time constant is of a value that can pass a mild timing test of wafer testing. An interconnection for transferring output data of each mat to bonding pad 9 is also required, as well as an interconnection of the power source for a peripheral circuit of each mat and a master peripheral circuit.

These interconnections are to be electrically disconnected by a TE signal or the like after the CSP process since these interconnections are no longer required. There is almost no increase in the chip area corresponding to this provisional aluminum interconnection.

Ninth Embodiment

The previous eighth embodiment was described of a structure for a minimum signal input. Various modifications thereof are possible such as providing a CLK pin for receiving an externally applied basic clock, or additionally providing an address pad to apply an address, or providing a pad for an output of a defective address.

Tenth Embodiment

When there is a Vref (reference potential) pin in an external pin, the prior second embodiment shows a structure in which a frame interconnection of Vref is shielded by a frame interconnection of a power supply for the purpose of avoiding noise in the Vref. However, generation of current noise in the frame interconnection of Vref must be taken into account when current is conducted to the power supply line that shields the Vref frame interconnection.

A technique to circumvent the problem of a great noise included in the Vref is to shield the frame interconnection of the Vref with a power supply line where no current flows (a frame interconnection that does not have a circuit that consumes current at the end thereof). This structure of shielding a Vref frame interconnection with a power supply line to which current does not flow can be easily formed as described in the second embodiment (FIG. 2).

Eleventh Embodiment

Figure 20:
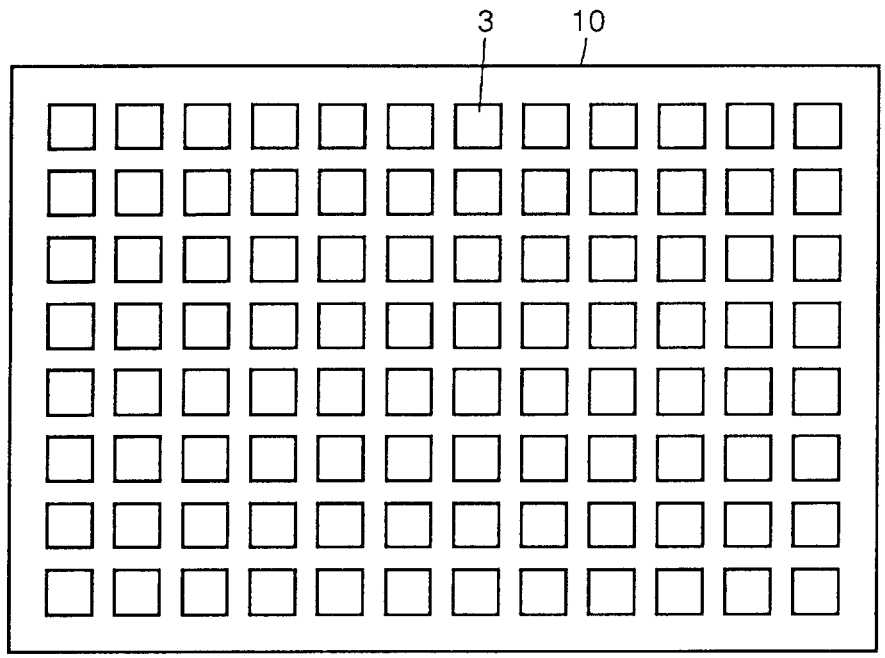
FIG. 20 is a schematic plan view showing arrangement of a bump pad in a semiconductor package according to a eleventh embodiment of the present invention.

As shown in FIG. 20, a plurality of bump pad terminals can be arranged individually all over the surface of a package regardless of whether a frame interconnection is connected or not. This overall arrangement of conductive bump pad terminals contributes to improvement of heat radiation in the package, whereby heat resistance is lowered.

Insulation from the board can be maintained by applying an insulation coat on the surface of a bump pad that is not electrically used.

The bump pad terminal can also be provided at the back side of the package. Heat radiation of the package can further be improved by providing bump pads on opposite sides of the package.

Twelfth Embodiment

A test mode such as a line test and a multi-bit parallel test is introduced to comply with increase in a testing time duration due to a greater capacity of the memory. However, all the tests cannot be implemented with the test mode.

Figure 21:
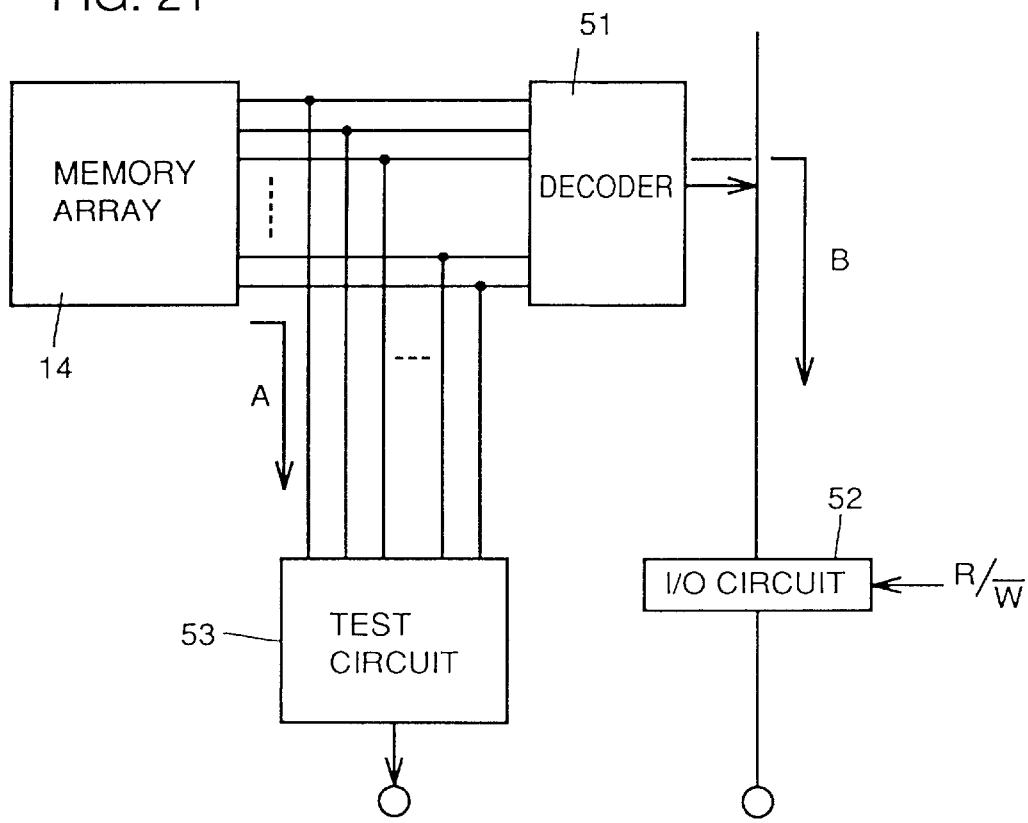
FIG. 21 is a block diagram for describing difference in the access path between a normal operation and a testing operation when a test mode is incorporated.

A test circuit 53 must be provided in order to implement a test mode that is introduced as shown in FIG. 21.

Therefore, the access path during testing is that shown by arrow A passing through test circuit 53. In contrast, an access path of a normal operation is that shown by arrow B passing through a decoder 51 and an I/O circuit 52.

The test mode could not be used for measuring the access time since the access path differs between a normal operation mode and a testing operation mode.

The number of bits per one I/O is not increased although the number of bits is increased in accordance with a greater memory capacity. Although increase in the testing time is suppressed, a greater number of comparators will be required in testing. This will restrict the number that can be measured at one time in the testing to degrade the testing efficiency. In view of the foregoing, an approach of degenerating data provided to respective I/O to be output by only one I/O is employed to improve the test efficiency.

However, the access path still differs between a normal output and dedegeneracy I/O even with such a structure.

Figure 22:
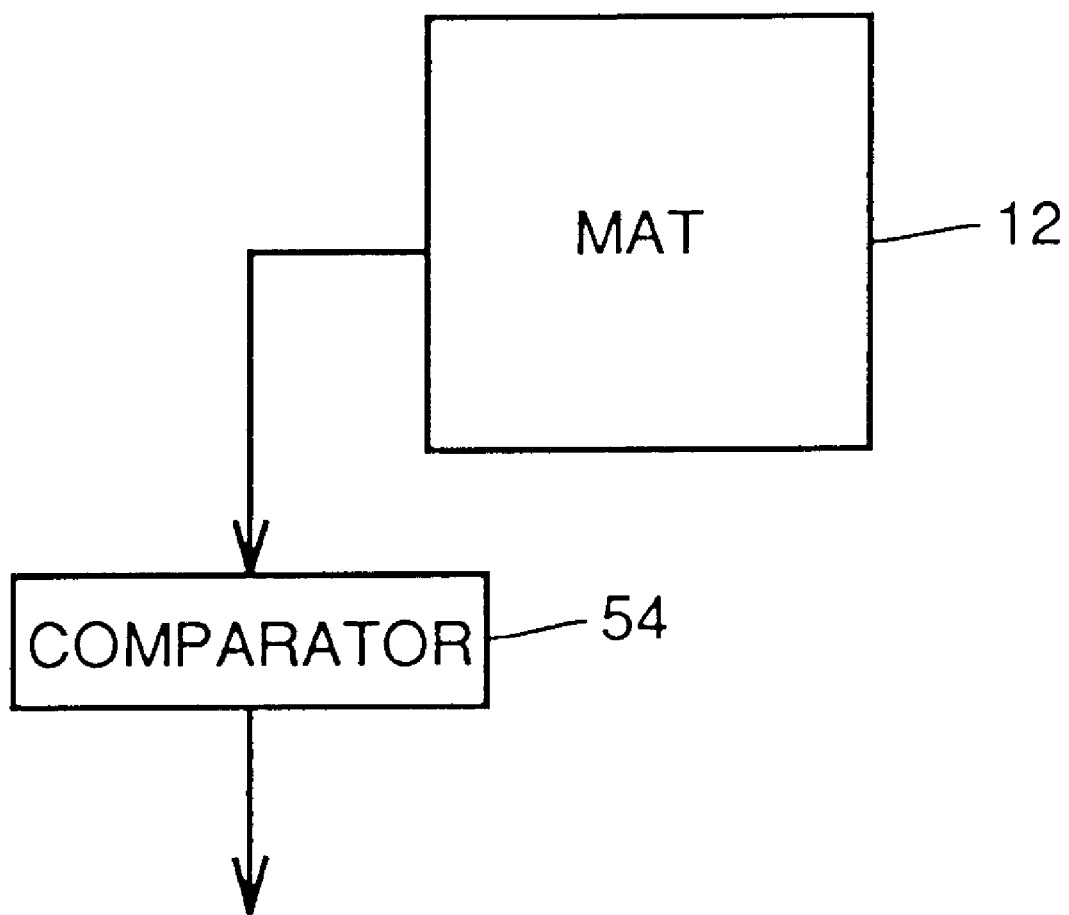
FIG. 22 is a block diagram showing connection of a comparator to a mat.

In the chip configuration of the fourth embodiment, each mat 12 is arranged in symmetry with respect to input bump electrode 4 as shown in FIG. 5. When the integrated semiconductor device shown in FIG. 5 is a 1 GDRAM with a 16 Mbit×64 organization, each mat 12 has the same structure of a 16 Mbit×16 organization. Since each mat 12 is arranged symmetrically and has the same structure, the access time to each mat 12 is substantially identical. Therefore, the access time of only one mat 12 needs to be measured to obtain the access time. It is not necessary to measure the access time of all the other mats. This means that comparator 54 shown in FIG. 22 is to be connected to only one of the plurality of mats 12. Therefore, the number of comparators can be reduced to ¼.

By sharing the same access path and allowing an I/O false dedegeneracy test, measurement testing of the access time or the like can easily be carried out even when the capacity of the DRAM is further increased.

Thirteenth Embodiment

In general, the number of pins for a semiconductor package mounted with a memory was smaller than those mounted with logics. Therefore, a memory is mounted in a semiconductor package of a type such as a DIP (Dual-In Line) having pins protruding from two sides of the semiconductor package.

It is expected that the number of pins of a memory will increase in accordance with a larger scale integration of the memory. A possible consideration is to mount such a highly integrated memory in a semiconductor package of a type in which pins are protruding from four sides such as a QFP (Quad Flat Package).

However, problems set forth in the following will occur even if this QFP is used when the integration density is further increased for the memory by conversion to hierarchy as described in the fourth embodiment.

Since the required number of pins for the memory is increased due to the hierarchy conversion, a great number of leads will become necessary. This will cause increase in the size of the semiconductor package.

If the pitch between the leads is reduced to suppress increase in the size of the semiconductor package, a great capacitance will be generated between the leads.

The present embodiment shows a semiconductor package other than of a CSP structure that can have these problems solved.

Figure 23:
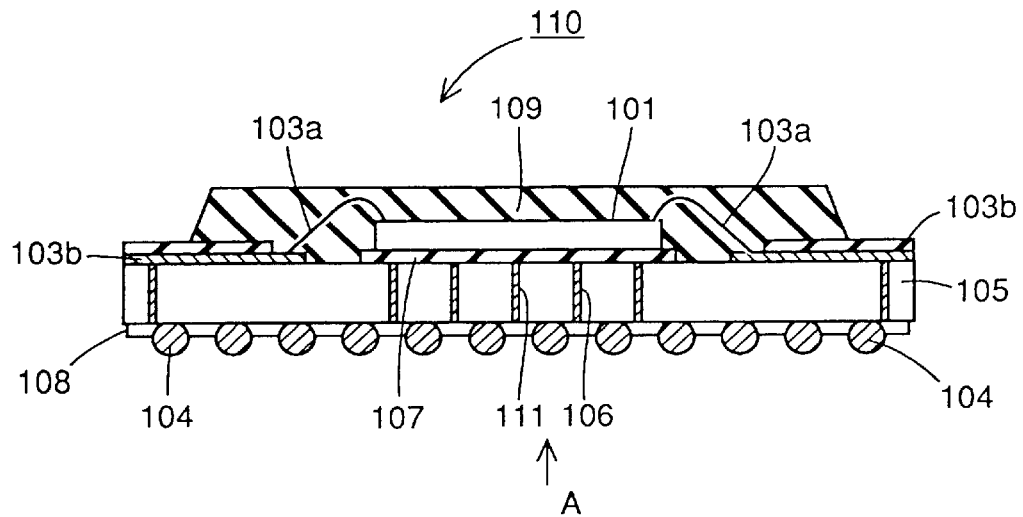
FIG. 23 is a sectional view of a semiconductor package of a BGA structure according to a thirteenth embodiment of the present invention.

FIG. 23 schematically shows a structure of a semiconductor package of a BGA structure. Referring to FIG. 23, a semiconductor chip 101 is fixed to a printed circuit board 105 by a die bonding epoxy 107. A pad (not shown) of semiconductor chip 101 is electrically connected to substrate interconnection 103*b* provided at the surface of printed circuit board 105 via a bonding wire 103*a*. Substrate interconnection 103*b* is electrically connected to a solder bump 104 located at the back side surface of printed circuit board 105 via a through hole 106. A solder resist 108 is formed on the back side surface of printed circuit board 105 except for the region where solder bump 104 is formed. Semiconductor chip 101, bonding wire 103*a* and substrate interconnection 103*b* are sealed by a mold material 109.

Figure 24:
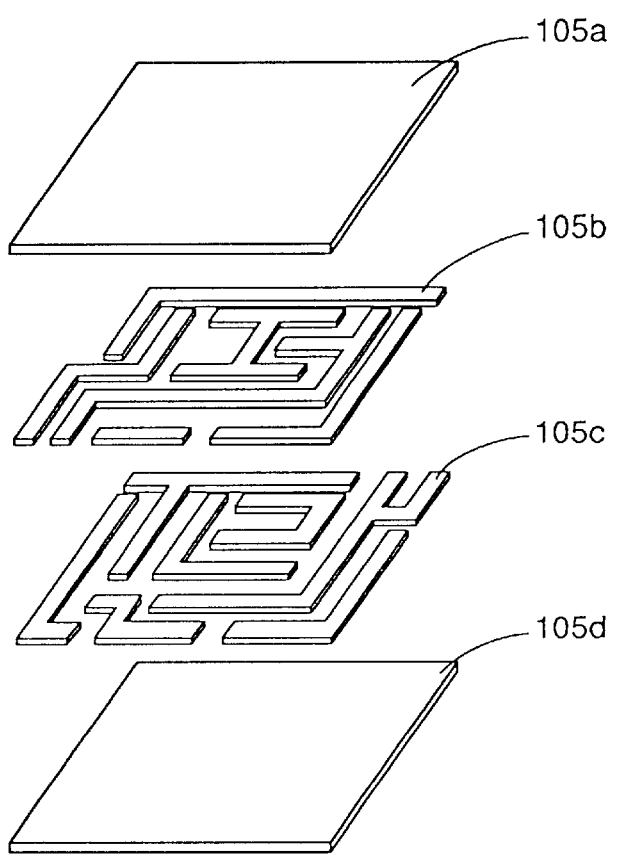
FIG. 24 is a perspective view of each conductive layer forming a printed circuit board 105.
Figure 25:
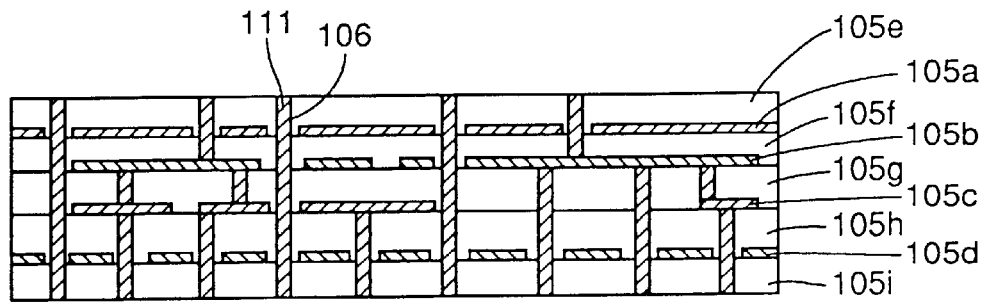
FIG. 25 is a sectional view of a printed circuit board.

Printed circuit board 105 has a multilayer structure in which a plurality of conductive layers 105*a*–105*d* shown in FIG. 24 are layered sandwiching respective insulation layers 105*e*–105*i* as shown in FIG. 25. Through hole 106 is filled with a buried conductive layer 111.

Conductive layers 105*a* and 105*d* are formed all over excluding the region where through hole 106 is provided and set to GND potential.

The semiconductor package of a BGA structure is common to a semiconductor package of a CSP structure in that it is electrically connected to a board via bump electrode (solder bump) 104.

The semiconductor package of a CSP structure is similar in size to a semiconductor chip. The size of this semiconductor chip differs from manufacturer to manufacturer. It is therefore difficult to standardize the size of a semiconductor package of a CSP structure for each manufacturer. In contrast, the dimension of a semiconductor package of a BGA structure can easily be standardized by usage of a printed circuit board 105.

In a semiconductor package of a CSP structure, the elements of the semiconductor substrate are easily subjected to stress since a bump electrode is formed on the plane where the elements are formed. In contrast, a semiconductor package of BGA structure has bump electrode (solder bump) 104 provided at the back surface opposite to where the elements are formed. Therefore, the elements are not easily subjected to stress.

Since conductive layers 105*a* and 105*d* having GND potential are formed all over the printed circuit board, conductive layers 105*b* and 105*c* sandwiched by conductive layers 105*a* and 105*d* are electrically shielded from other conductive portions. Therefore, the noise of conductive layers 105*b* and 105*c* are reduced.

A structure of a semiconductor chip mounted in a semiconductor package of a BGA structure will be described hereinafter.

Figure 26:
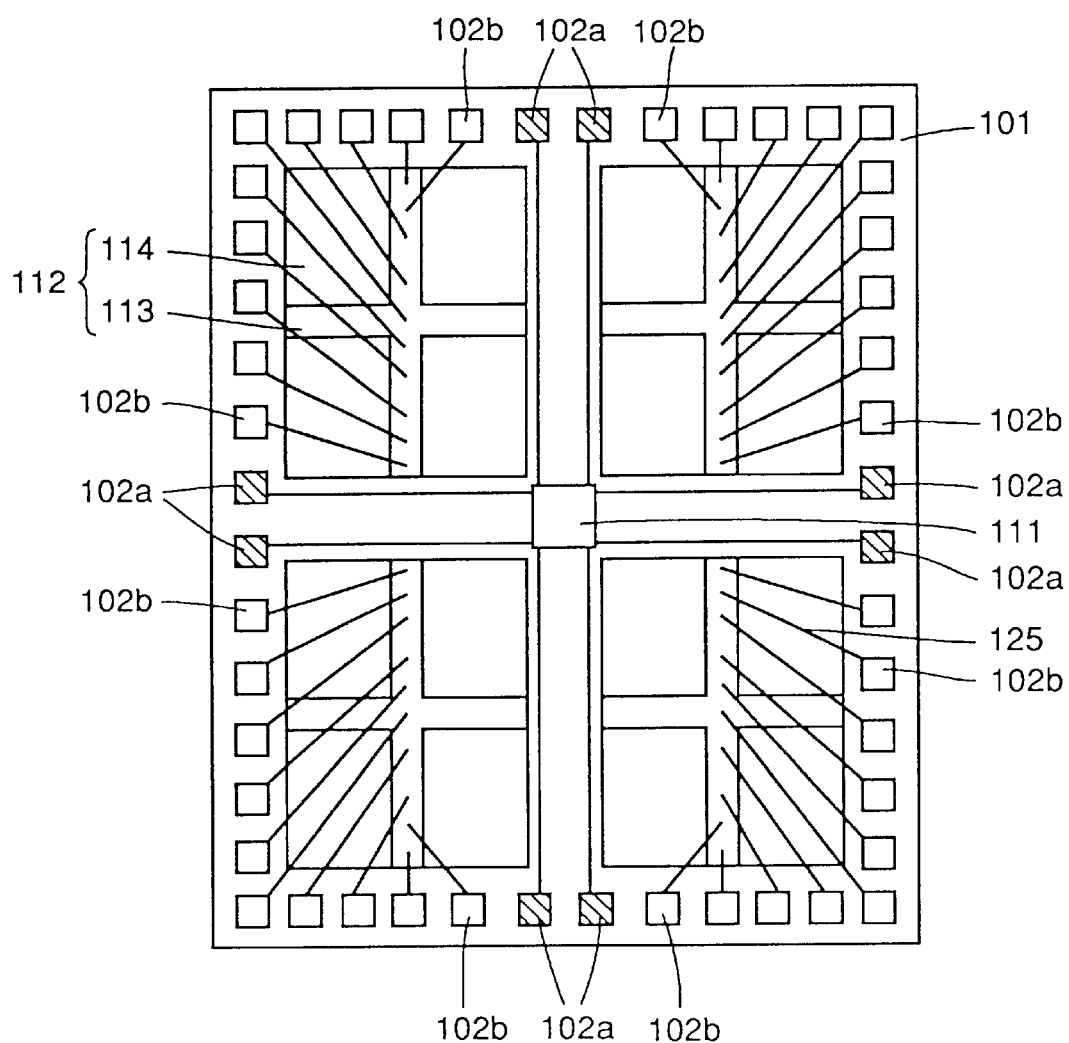
FIG. 26 is a plan view of a layout of a semiconductor chip mounted in the semiconductor package of the thirteenth embodiment.

FIG. 26 schematically shows a plan view of a plan layout of a semiconductor chip mounted in the semiconductor package of the thirteenth embodiment. Referring to FIG. 26, a semiconductor chip 101 includes four, for examples, mats 112, and a master peripheral circuit 111 for controlling each mat 112. Master peripheral circuit 111 is arranged between each mat 112 in a cross manner.

For the sake of description, master peripheral circuit 111 is illustrated as located at the center of the cross in FIG. 26.

Each mat 112 includes a memory array 114, and a local peripheral circuit 113 for controlling a corresponding memory array 114.

A plurality of pads 102*a*, 102*b* are provided on the main surface of semiconductor chip 101 at an outer circumferential region of the region where the four mats 112 and master peripheral circuit 111 are formed. Pad 102*a* serves to enter a signal for controlling the chip overall, and is directly connected to master peripheral circuit 111. Pad 102a is provided at an outer circumferential region of semiconductor chip 101 and arranged so as to take a position closest to master peripheral circuit 111. This prevents degradation of the signal applied from pad 102a into master peripheral circuit 111.

Pad 102b serves to input/output a signal for controlling each mat, and is directly connected to local peripheral circuit 113. Pad 102b is arranged so that the distance of the interconnection between each of pads 102b and local peripheral circuit 113 is substantially identical. This provides the advantage of minimizing phase offset between each signal transmitted between pad 102b and local peripheral circuit 113, i.e. the skew.

Each of pads 102a and 102b are arranged at the outer circumferential region of semiconductor chip 101 due to the fact that the pad is connected to substrate interconnection 103b by bonding wire 103a in a semiconductor package of a BGA structure as shown in FIG. 23.

Each of the plurality of mats 112 are arranged so as to be symmetrical with respect to the position of the plurality of master peripheral circuits 111. Each of the plurality of mats 112 and each of the plurality of pads 102a and 102b are arranged so as to be symmetrical with respect to the center of semiconductor chip 101. This enables the transmission distance of a signal applied from master peripheral circuit 111 to each mat 112 to be set equal by such an arrangement.

In mat 112, each of the plurality of memory arrays 114 are arranged so as to be symmetrical with respect to the position of local peripheral circuit 113. Furthermore, each of the plurality of memory arrays 114 in mat 112 is arranged so as to be symmetrical with respect to the center of each mat 112. This enables the transmission distance of a signal applied from local peripheral circuit 113 to each memory array 114 to be set equal.

Since a BGA structure is employed in the semiconductor package of the present embodiment, solder bump 104 is provided for connection with an external terminal. Solder bump 104 can be arranged all over the surface of semiconductor chip 101. Even when a DRAM of high integration and hierarchy as shown in FIG. 26 is mounted in a semiconductor package, the problem of increase in dimension such as of a QFP semiconductor package and generation of a great capacitance between leads can be prevented.

Figure 27:
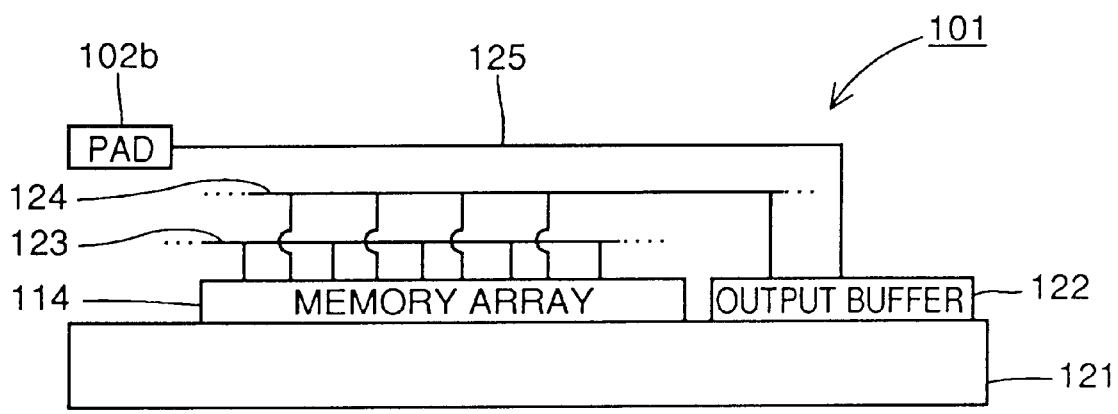
FIG. 27 is a diagram for describing that the interconnection for connecting a pad and a local peripheral circuit is formed at the top layer in a chip.

An interconnection 125 for connecting pad 102b with an output buffer of local peripheral circuit 113, and an interconnection for connecting pad 102b with an output buffer 122 of local peripheral circuit 113 are arranged at the top most layer from the surface of semiconductor substrate 121 in semiconductor chip 101 as shown in FIG. 27. This means that interconnection 125 is formed upper than interconnections 123 and 124 connected to each memory element in memory array 114. Therefore, these interconnections 125 can be arranged in the shortest linear distance from pads 102a and 102b to a position to be connected. Thus, degradation of data within interconnection layer 125 can be prevented.

As described in the previous sixth embodiment, the usage of a decoder as a mat select function allows selection of a particular mat 112 from the plurality of mats 112, and also selection of a combination of a predetermined number of mats 112. More specifically, with a mat select function, the memory organization can be made variable by arbitrarily setting two 512 MDRAMs or five 256 MDRAMs with a whole chip of 1 MDRAM. In other words, the memory organization can be formed as if it is a module of a variable bit size.

Each of mats 112 de-selected by the mat select function has the power supply towards local peripheral circuit 113 in mat 112 cut off. Therefore, power consumption can be reduced in comparison with the case where a predetermined voltage is applied to de-selected mat 112 to attain a standby state.

Figure 28:
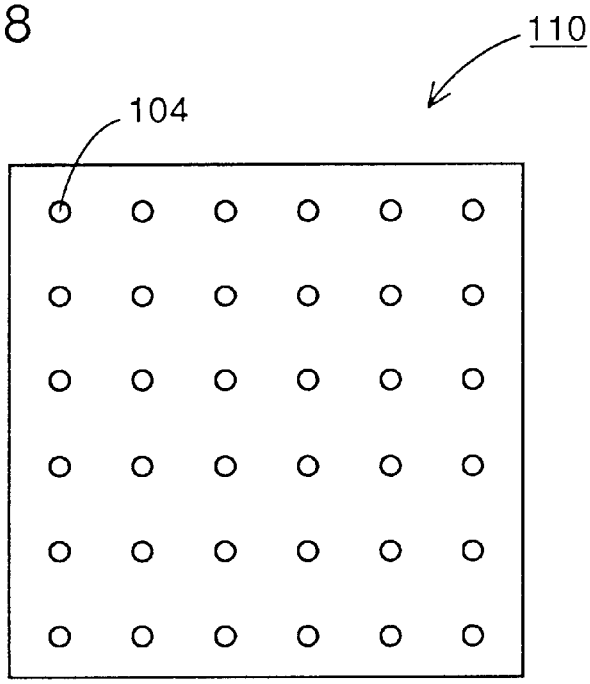
FIG. 28 is a plan view schematically showing arrangement of solder bumps, particularly, in the semiconductor package of the thirteenth embodiment.

According to the semiconductor package of the present embodiment, each of the plurality of solder bumps 104 are arranged individually on the entire surface of the package independent of whether it is electrically connected to pads 102a and 102b of semiconductor chip 101 as shown in FIG. 28. Heat dissipation of the package can be improved by providing conductive solder bump 104 all over the surface. Therefore, the heat resistance can be reduced.

FIG. 28 is a plan view of a semiconductor package viewed from the direction of arrow A of FIG. 23.

Figure 29:
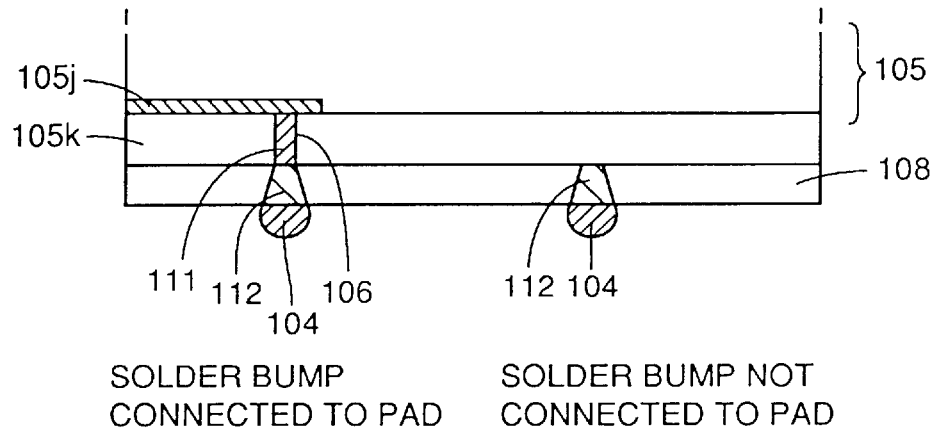
FIG. 29 is a sectional view of a solder bump electrically connected to a pad.
Figure 30:
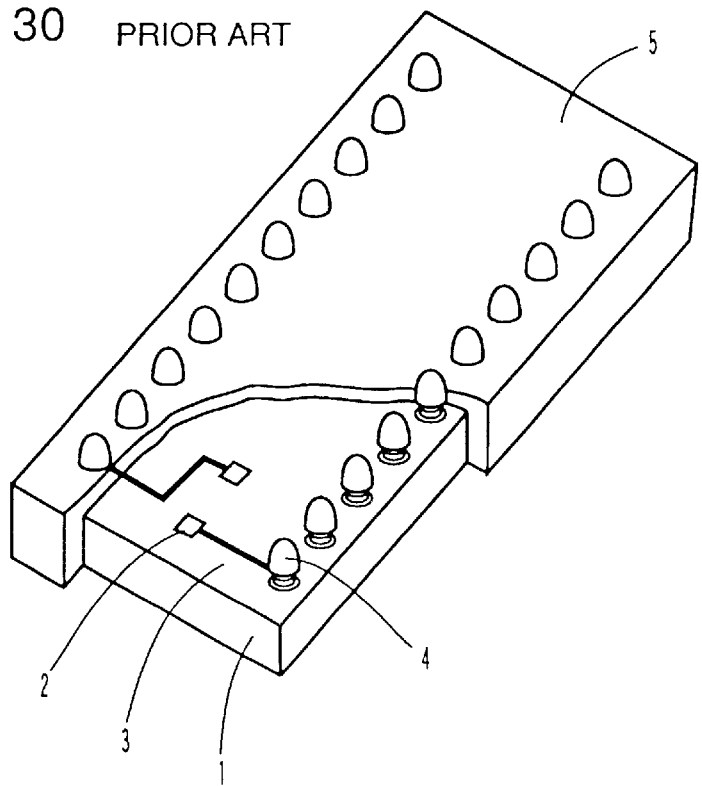
FIG. 30 is a perspective view showing a structure of a general CSP.
Figure 31:
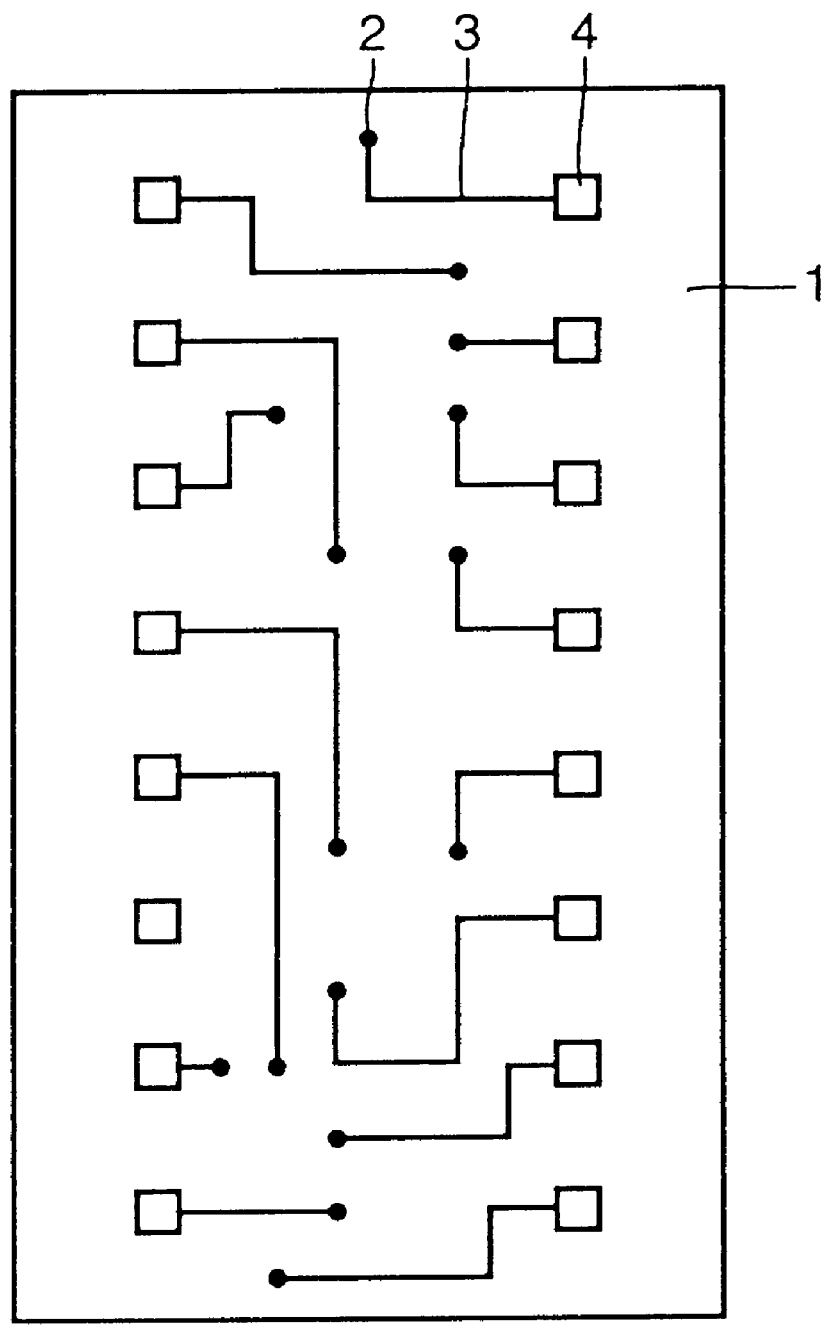
FIG. 31 is a plan view showing a structure of a general CSP.

A solder bump 104 not electrically connected to a pad is formed on the surface of printed circuit board 105 with conductive layer 112 therebetween as shown in FIG. 29.

The surface of a solder bump 104 not electrically used can have an insulation coat applied thereon to maintain insulation from the board.

According to the structure of the semiconductor chip of the present embodiment, mats 112 are arranged symmetrical to master peripheral circuit 111 as shown in FIG. 26, wherein each mat 112 has the same structure. Therefore, the access time for each mat 112 can be measured by connecting a comparator 54 shown in FIG. 22 to just one mat 112.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor apparatus comprising a plurality of external interconnection units, each said external interconnection unit being formed of a bump electrode provided on a main surface of a semiconductor chip including an integrated semiconductor device for external connection, a pad formed at said semiconductor chip for connection with said integrated semiconductor device, and a connection interconnection formed on the main surface of said semiconductor chip for electrically connecting said pad and said bump electrode, wherein said integrated semiconductor device includes a sense amplifier circuit, and all said bump electrodes included in respective said external interconnection units are formed on a region other than a region where said sense amplifier circuit is provided, and a bump electrode layer is formed on an element formation region, other than the region where the sense amplifier circuit is provided, in which all of said bump electrodes are included.

2. The semiconductor apparatus according to claim 1, wherein said sense amplifier circuit comprises a pair of transistors for sensing and amplifying a potential difference between a pair of bit lines.

3. The semiconductor apparatus according to claim 1, wherein said sense amplifier circuit comprises an analog circuit.

4. The semiconductor apparatus according to claim 1, comprising a stress relaxing material right under said bump electrode and between said connection interconnection and the main surface of said semiconductor chip for relaxing mechanical stress applied on said semiconductor chip via said bump electrode.

5. A semiconductor apparatus comprising a plurality of external interconnection units, each said external interconnection unit being formed of a bump electrode provided on a main surface of a semiconductor chip including an integrated semiconductor device for external connection, a pad formed at said semiconductor chip for connection with said integrated semiconductor device, and a connection interconnection formed on the main surface of said semiconductor chip for electrically connecting said pad and said bump electrode, said semiconductor apparatus including at least a power supply pad provided on the main surface of said semiconductor chip for supplying power to said integrated semiconductor device, and a power supply interconnection connected to said power supply pad, and provided so as to surround each of at least a portion of said plurality of external interconnection units individually.

6. The semiconductor apparatus according to claim 5, wherein said power supply interconnection surrounding at least a portion of said external interconnection units individually is connected to each other to form a mesh, and wherein a plurality of said power supply pads are arranged so that power supply impedance with respect to mesh-like said power supply interconnection is reduced.

7. The semiconductor apparatus according to claim 5, comprising a stress relaxing material right under said bump electrode and between said connection interconnection and the main surface of said semiconductor chip for relaxing mechanical stress applied on said semiconductor chip via said bump electrode.

8. A semiconductor apparatus comprising a plurality of external interconnection units, each said external interconnection unit being formed of a bump electrode provided on a main surface of a semiconductor chip including an integrated semiconductor device for external connection, a pad formed at said semiconductor chip for connection with said integrated semiconductor device, and a connection interconnection formed on the main surface of said semiconductor chip for electrically connecting said pad with said bump electrode; wherein: said integrated semiconductor device includes an input/output buffer circuit directly connected to said pad;

said bump electrode electrically connected to said input/output buffer circuit via said pad is provided on a region in proximity to said input/output buffer circuit; said integrated semiconductor device comprises a plurality of memory mats and a master peripheral circuit for dividing a plurality of said memory mats and controlling each memory mat independently; and each of said plurality of memory mats comprises a plurality of memory regions including a memory elements, and a local peripheral circuit for dividing said plurality of memory regions and controlling a memory element in each memory region.

9. The semiconductor apparatus according to claim 8, further comprising a second connection interconnection formed on the main surface of said semiconductor chip, wherein said master peripheral circuit and said local peripheral circuit are electrically connected by said second connection interconnection.

10. The semiconductor apparatus according to claim 8, wherein said bump electrode for entering a signal transmitted to each of said plurality of memory mats through said master peripheral circuit is provided on a region where said master peripheral circuit is provided, wherein each of said plurality of memory mats is arranged so as to be symmetrical with respect to a position of said bump electrode, wherein each interconnection connected to a plurality of said memory mats from said bump electrode is arranged so as to be symmetrical with respect to a position of said bump electrode.

11. The semiconductor apparatus according to claim 8, wherein a transmission distance of a signal entered into each of said plurality of memory mats from said bump electrode is substantially equal.

12. The semiconductor apparatus according to claim 8, wherein said bump electrode for providing an output signal from said memory element to an outside world is electrically connected to said output buffer circuit, wherein said bump electrode for output, electrically connected to said pad for output, is arranged on a region where said local peripheral circuit including said output buffer circuit is provided.

13. The semiconductor apparatus according to claim 8, wherein said connection interconnection includes first and second connection interconnections extending at different levels on the main surface of said semiconductor chip and electrically insulated from each other.

14. The semiconductor apparatus according to claim 8, wherein said connection interconnection includes first and second connection interconnections extending at the same level on the main surface of said semiconductor chip, wherein electrical insulation of said first and second connection interconnections is maintained by one of said first and second connection interconnections being electrically connected to a conductive layer formed within said semiconductor chip at a crossing of said first and second connection interconnections.

15. The semiconductor apparatus according to claim 8, wherein said bump electrode for power to be supplied to said output buffer circuit is arranged on a region where said local peripheral circuit including said output buffer circuit is provided.

16. The semiconductor apparatus according to claim 8, wherein said bump electrode for output that is electrically connected to each of said plurality of memory elements in said memory region and that is electrically connected to a data bus for data output of said plurality of memory elements is arranged on a region in proximity to said memory region.

17. The semiconductor apparatus according to claim 8, wherein said master peripheral circuit comprises a mat select circuit for selecting and rendering operable one of said plurality of memory mats, and inhibiting supply of power towards said local peripheral circuit in said memory mat that is non-selected.

18. The semiconductor apparatus according to claim 8, wherein said master peripheral circuit comprises a mat select circuit for selecting and rendering operable a predetermined number of said memory mats, and inhibiting supply of power towards said local peripheral circuit in said memory mat that is non-selected.

19. The semiconductor apparatus according to claim 8, wherein a power supply conductive layer for supplying a power supply voltage to an element in said integrated semiconductor device is formed within said semiconductor chip, wherein said connection interconnection to which a power supply voltage is applied from said bump electrode extends in a direction crossing the extending direction of said power supply conductive layer, and is electrically connected to said power supply conductive layer.

20. The semiconductor apparatus according to claim 19, wherein said element comprises a sense amplifier circuit formed of a pair of transistors for sensing and amplifying a small potential difference between a pair of bit lines, wherein said connection interconnection and said power supply conductive layer are arranged so as to form a mesh in plane.

21. The semiconductor apparatus according to claim 8, wherein said semiconductor chip includes a test pad for bringing a probe needle of a prober in contact in a test mode, wherein said test pad is formed at a main surface of said semiconductor chip on a region other than where said integrated semiconductor device is provided.

22. The semiconductor apparatus according to claim 8, further comprising an oscillator activated in response to an externally applied test signal in a test mode, and a control signal generator for generating a control signal by said oscillator, wherein said control signal generator is connected to said master peripheral circuit so that a signal output from said control signal generator is applied to said master peripheral circuit.

23. The semiconductor apparatus according to claim 8, further comprising a shift register that sequentially stores a pass/fail state of test data obtained from each of the plurality of said memory mats and sequentially providing the stored pass/fail state of test data in a test mode.

24. The semiconductor apparatus according to claim 23, wherein a signal indicating a pass/fail state of said test data provided from said shift register is output from a test pad provided in said semiconductor chip.

25. The semiconductor apparatus according to claim 21, wherein said test pad and said pad are electrically connected to said local peripheral circuit by different interconnection paths, wherein a first interconnection between said test pad and said local peripheral circuit can be switched between connection and non-connection, and a second interconnection between said pad and said local peripheral circuit can be switched between connection and non-connection, wherein said first interconnection attains a connected state, and said second interconnection attains a non-connected state in a test mode, wherein said first interconnection attains a non-connected state, and said second interconnection attains a connected state in a normal operation mode.

26. The semiconductor apparatus according to claim 8, further comprising means for determining and storing a defective address of said memory element from a pass/fail state of test data obtained from each of a plurality of memory mats in a test mode, wherein a signal of said defective address is sequentially provided from said means.

27. The semiconductor apparatus according to claim 26, wherein a signal of said defective address provided from said means that determines and stores a defective address is output from a test pad provided in said semiconductor chip.

28. The semiconductor apparatus according to claim 8, further comprising a power supply interconnection provided on a main surface of said semiconductor chip so as to surround said connection interconnection to which a predetermined potential is applied, wherein said power supply interconnection is formed so that no current flows.

29. The semiconductor apparatus according to claim 8, wherein said plurality of bump electrodes are arranged isolated from each other and so as to be exposed from an entire surface of said semiconductor apparatus.

30. The semiconductor apparatus according to claim 29, wherein said plurality of bump electrodes include a bump electrode that is not electrically connected to said pad.

31. The semiconductor apparatus according to claim 29, wherein a plurality of said bump electrodes are arranged isolated from each other and so as to be exposed from a back side of said semiconductor apparatus.

32. The semiconductor apparatus according to claim 11, wherein a comparator that selects a predetermined number of memory elements from said memory mat in a test mode, determines match/mismatch of logic of said predetermined number of memory elements, and provides a determination result thereof is connected to only one of said plurality of memory mats.

33. A semiconductor apparatus comprising a semiconductor chip including an integrated semiconductor device, wherein said integrated semiconductor device includes a plurality of memory mats and a master peripheral circuit for dividing said plurality of memory mats and controlling independently each said memory mat, wherein said memory mat includes a plurality of memory elements, further comprising means for determining and storing a defective address of said memory element from a pass/fail state of test data provided from each of the plurality of memory mats in a test mode, wherein a signal of said defective address is sequentially provided from said means.

34. A semiconductor apparatus comprising:

a plurality of external interconnection units, each said external interconnection unit being formed of a bump electrode provided on a main surface of a semiconductor chip including an integrated semiconductor device for external connection, a pad formed at said semiconductor chip for connection with said integrated semiconductor device, and a connection interconnection formed on the main surface of said semiconductor chip for electrically connecting said pad with said bump electrode; and an interconnection provided on the main surface of said semiconductor chip so as to surround said connection interconnection to which a predetermined potential is applied, wherein said interconnection is formed so that current does not flow.

35. A semiconductor apparatus comprising a pad on a main surface of a semiconductor chip including an integrated semiconductor device, wherein said integrated semiconductor device includes a plurality of memory mats and a master peripheral circuit for dividing said plurality of memory mats and controlling each said memory mat independently, wherein said memory mat includes a plurality of memory elements, wherein each of said plurality of memory mats is arranged so that a transmission distance of a signal from said pad to each of said plurality of memory mats is substantially identical, wherein a comparator selecting a predetermined number of memory elements from said memory mat in a test mode, determining match/mismatch of logic of said predetermined number of memory elements, and providing a comparison result thereof is connected to only one of said plurality of memory mats.

36. A semiconductor apparatus comprising a plurality of external interconnection units, each said external interconnection unit having a bump electrode provided at a back surface side of a semiconductor chip including an integrated semiconductor device for external connection, a bonding pad formed at said semiconductor chip for connection with said integrated semiconductor device, and a connection interconnection for electrically connecting said bonding pad and said bump electrode, wherein said integrated semiconductor device comprises a plurality of memory mats, and a master peripheral circuit for dividing a plurality of said memory mats and controlling each of said plurality of memory mats independently, wherein each of said plurality of memory mats comprises a plurality of memory arrays, and a local peripheral circuit for dividing a plurality of said memory arrays and controlling each said memory array, said semiconductor apparatus further comprising a substrate for fixing said semiconductor chip at a back surface side of a surface of said substrate where said semiconductor chip is fixed, wherein said bump electrode and said bonding pad are electrically connected through a hole provided in said substrate.

37. The semiconductor apparatus according to claim 36, wherein a plurality of said bonding pads are arranged at the main surface of said semiconductor chip at an outer circumferential region of a region where a plurality of said memory mats and said master peripheral circuit are arranged, and wherein said bonding pad electrically connected to said master peripheral circuit is arranged in said outer circumferential region at a position so that a distance from said master peripheral circuit is substantially shortest.

38. The semiconductor apparatus according to claim 36, wherein each of a plurailty of said memory mats and each of a plurality of said bonding pads are arranged so as to be symmetrical with the position of said master peripheral circuit.

39. The semiconductor apparatus according to claim 36, wherein a transmitting distance of a signal that is inout and/or output between each of said plurality of bonding pads electrically connected to said master peripheral circuit and said master peripheral circuit is substantially equal, and, wherein a transmitting distance of a signal input and output between each of a plurality of said local peripheral circuits and said master peripheral circuit is substantially equal.

40. The semiconductor apparatus according to claim 37, wherein a plurality of said bonding pads electrically connected to said local peripheral circuit of a particular memory mat out of a plurality of said memory mats are arranged in said outer circumferential region and along a contour of said particular memory mat.

41. The semiconductor apparatus according to claim 36, wherein an interconnection layer connecting said local peripheral circuit and said bonding pad, and an interconnection layer connecting said master peripheral circuit and said bonding pad are formed on the top most layer from the semiconductor substrate out of all interconnection layers formed in said semiconductor.

42. The semiconductor apparatus according to claim 36, wherein said master peripheral circuit comprises a mat select circuit for selecting and rendering operable one of said plurality of memory mats, and inhibiting supply of power towards said local peripheral circuit in a memory mat that is non-selected.

43. The semiconductor apparatus according to claim 36, wherein said master peripheral circuit comprises a mat select circuit for selecting and rending operable a predetermined number of said memory mats, and inhibiting supply of power towards said local peripheral circuit in a memory mat that is non-selected.

44. The semiconductor apparatus according to claim 36, further comprising a bump electrode that is not electrically connected to said bonding pad.

45. The semiconductor apparatus according to claim 36, wherein a comparator that determines match/mismatch of logic of a predetermined number of memory elements selected from each of said plurality of memory mats in a test mode, and provides a determination result thereof is connected to only one of said plurality of memory mats.

46. The semiconductor apparatus according to claim 36, wherein said interconnection comprises a bonding wire, an interconnection formed at the surface of said substrate, and a filling conductive layer to fill a through hole in said substrate.

47. The semiconductor apparatus comprising a semiconductor chip with an integrated semiconductor device, wherein said integrated semiconductor device comprises a plurality of memory mats, and a master peripheral circuit for dividing a plurality of said memory mats and controlling each of said plurality of memory mats independently, wherein each of said plurality of memory mats comprises a plurality of memory arrays, each having a plurality of memory elements, and a local peripheral circuit for dividing each of a plurality of said memory arrays and controlling said memory element in said plurality of memory arrays, said semiconductor apparatus comprising a first bump electrode formed at a region of said master peripheral circuit, a second bump electrode formed at a region of said local peripheral circuit, and a plurality of bonding pads formed at each region of a plurality of said local peripheral circuits, said first bump electrode being electrically connected via the first connection interconnection common to each said bonding pad formed at each of said plurality of local peripheral circuits, wherein each said first connection interconnection electrically connected to each said bonding pad from said first bump electrode is arranged so as to be axially symmetrical with respect to a line along an arrangement direction of each said first bump electrode, and wherein said second bump electrode a electrically connected by a second connection interconnection to one of a plurality of said bonding pads arranged in said local peripheral circuit where said second bump electrode is located.

48. The semiconductor apparatus according to claim 47, wherein each of a plurality of memory mats is arranged so as to be axially symmetrical with respect to a line along an arrangement direction of each said first bump electrode.

49. The semiconductor apparatus according to claim 47, wherein said bump electrode for output is arranged at a region of said local peripheral cicuit.

50. The semiconductor apparatus according to claim 47, wherein said bump electrode for input is arranged at a region of said master peripheral circuit.

* * * * *